(12) United States Patent
Takahashi et al.

(10) Patent No.: US 7,099,222 B2
(45) Date of Patent: Aug. 29, 2006

(54) REFRESH OPERATION TYPE SEMICONDUCTOR MEMORY DEVICE CAPABLE OF SMOOTHLY TRANSFERRING SPECIAL STATE TO NORMAL ACTIVE STATE AND ITS DRIVING METHOD

(75) Inventors: Hiroyuki Takahashi, Kawasaki (JP); Yoshiyuki Katoh, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/105,504

(22) Filed: Apr. 14, 2005

(65) Prior Publication Data
US 2005/0232050 A1    Oct. 20, 2005

(30) Foreign Application Priority Data
Apr. 14, 2004   (JP)   ............... 2004-119155

(51) Int. Cl.
G11C 7/00   (2006.01)
(52) U.S. Cl. ....................... 365/222; 365/233
(58) Field of Classification Search ............... 365/222, 365/233
See application file for complete search history.

(56) References Cited

U.S. PATENT DOCUMENTS

| | | | | |
|---|---|---|---|---|
| 4,207,618 A | * | 6/1980 | White et al. | 365/222 |
| 4,748,627 A | * | 5/1988 | Ohsawa | 714/764 |
| 4,935,900 A | * | 6/1990 | Ohsawa | 365/222 |
| 2006/0039220 A1 | * | 2/2006 | Takahashi et al. | 365/222 |
| 2006/0067151 A1 | * | 3/2006 | Miyamoto | 365/222 |

FOREIGN PATENT DOCUMENTS

| | | |
|---|---|---|
| JP | 2001-210074 | 8/2001 |
| JP | 2002-074944 | 3/2002 |

* cited by examiner

*Primary Examiner*—Michael Tran
(74) *Attorney, Agent, or Firm*—Young & Thompson

(57) ABSTRACT

In a semiconductor memory device incorporating a memory core circuit requiring a refresh operation, a clock signal modifying circuit receives an external clock signal to generate a modified clock signal which is ineffective from a timing when the control is switched from an active mode to a special mode to a timing when at least one clock pulse time period of the external clock signal has passed after the control is switched from said special mode to an active mode. A forced refresh request signal generating circuit generates a forced refresh request signal at predetermined time periods and an internal clock signal having the same period as said forced refresh request signal. An all-time refresh request signal generating circuit generates an all-time refresh request signal in synchronization with the modified clock signal and the internal clock signal. A multiplexer selects the forced refresh request signal in the special mode and selects the all-time refresh request signal in the actual mode. A refresh pulse generating circuit generates a refresh pulse signal in accordance with one of the forced refresh request signal and the all-time refresh request signal selected by the multiplexer and transmits the refresh pulse signal to the memory core circuit. A read/write pulse generating circuit generates a read/write pulse signal in synchronization with the modified clock signal and transmits the read/write pulse signal to the memory core circuit.

17 Claims, 17 Drawing Sheets

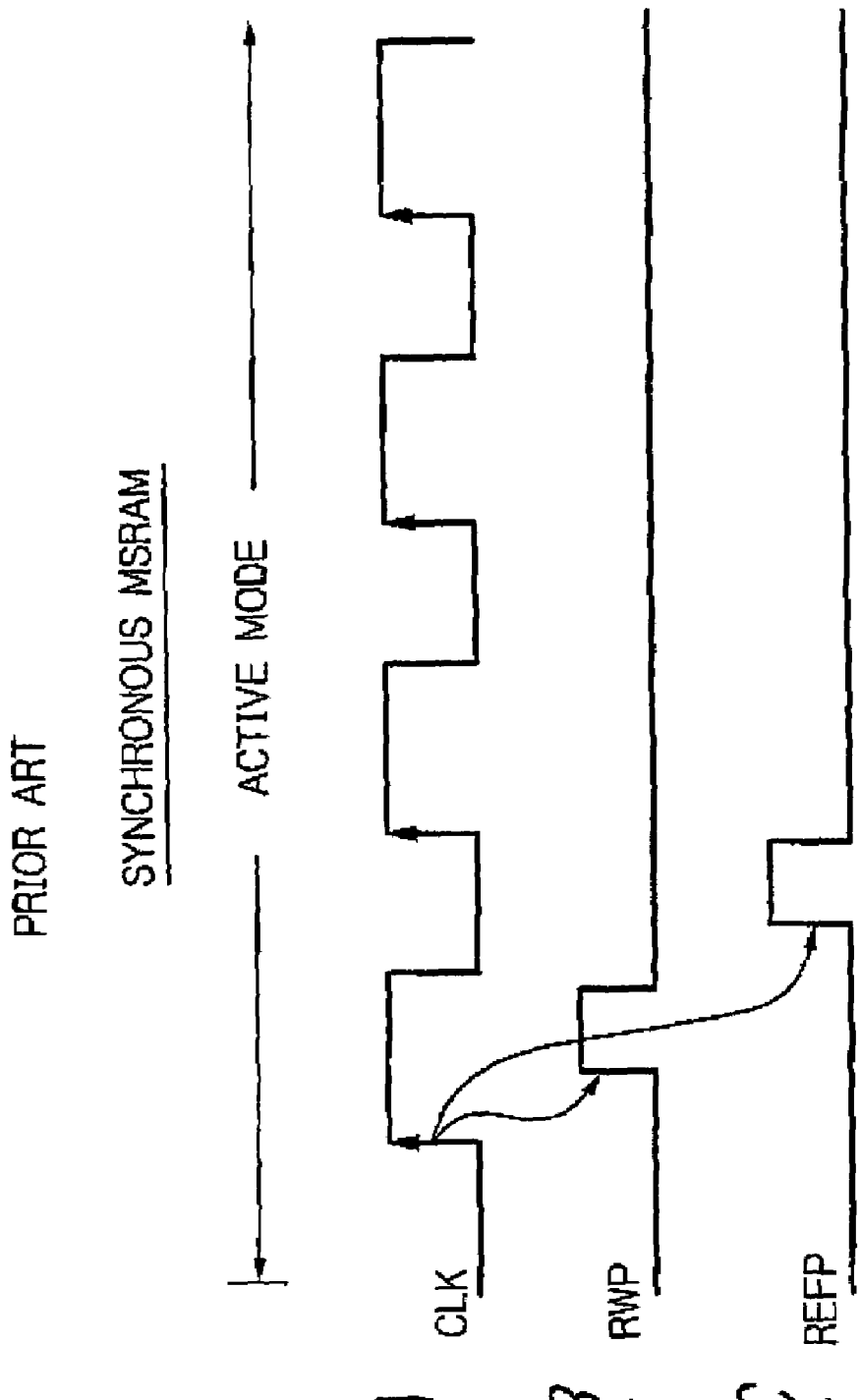

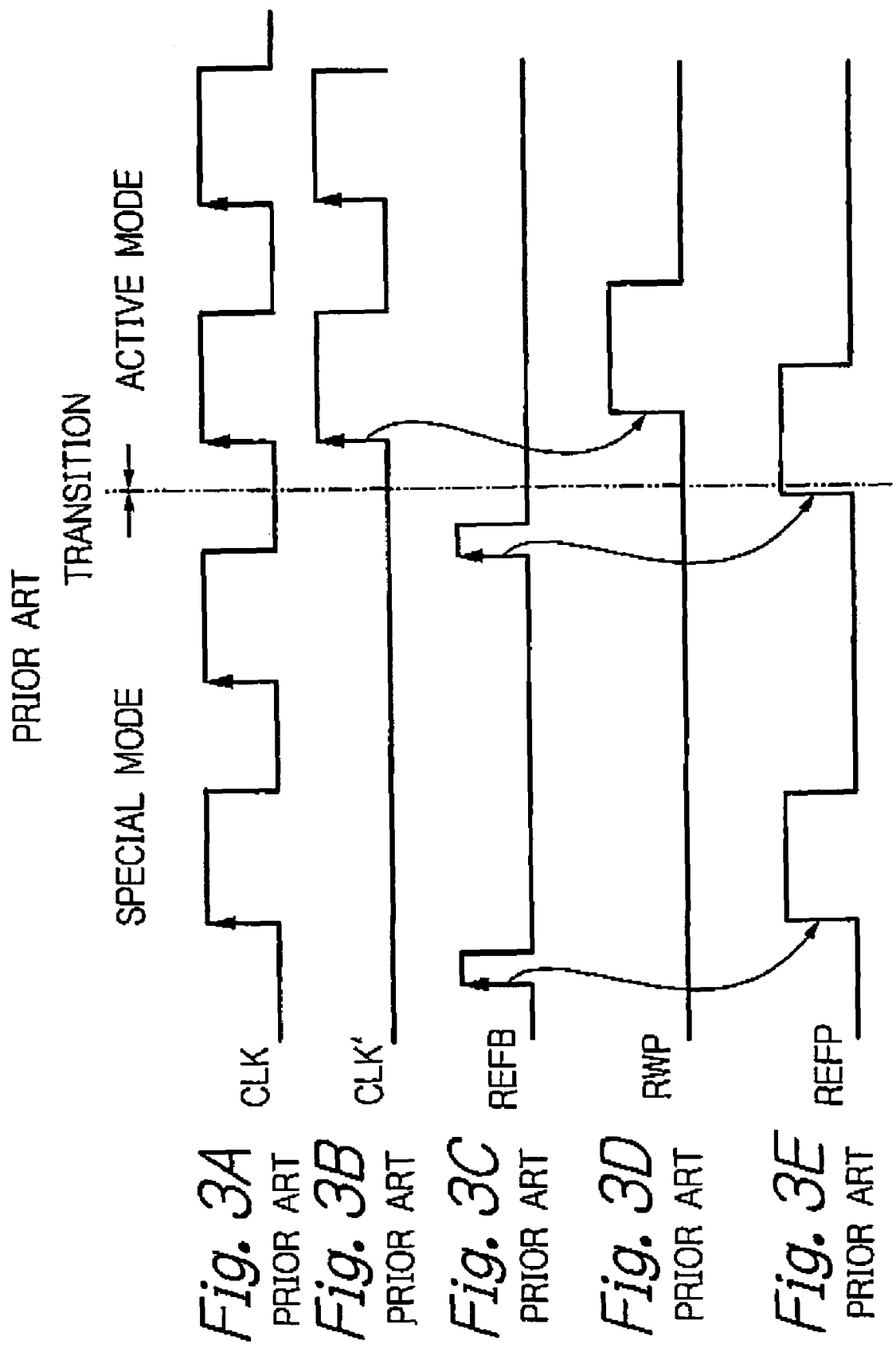

REFRESH OPERATION TYPE SEMICONDUCTOR MEMORY DEVICE CAPABLE OF SMOOTHLY TRANSFERRING SPECIAL STATE TO NORMAL ACTIVE STATE AND ITS DRIVING METHOD

BACKGROUND OF THE INVENTION

1. Field of the Invention

The present invention relates to a semiconductor memory device such as a pseudo static random access (PSRAM) device requiring a refresh operation and its driving method.

2. Description of the Related Art

As random access memory (RAM) devices, there are static random access memory (SRAM) devices and dynamic random access memory (DRAM) devices.

Firstly, the SRAM devices have an advantage that the SRAM devices can be operated at a higher speed than the DRAM devices.

Secondly, the SRAM devices have an advantage that the SRAM devices can be accessed, i.e., read from or written to by a simpler control than that of the DRAM devices. That is, in the SRAM devices, when an address signal is simply supplied thereto, an access operation such as a read operation or a write operation is carried out. On the other hand, in the DRAM devices, when a row address signal associated with a row address strobe (RAS) signal and a column address signal associated with a column address strobe (CAS) signal are supplied thereto, an access operation such as a read operation or a write operation is carried out.

Thirdly, the SRAM devices have an advantage in that the power consumption can be smaller than that of the DRAM devices. That is, the DRAM devices require a refresh operation for holding the memory content thereof even in a standby mode, while such a refresh operation is unnecessary in the SRAM devices.

However, the DRAM devices have an advantage in that the DRAM devices have a smaller size than that of the SRAM devices. That is, in the SRAM devices, one cell is generally constructed by six MOS transistors, while in the DRAM devices, one cell is generally constructed by one MOS transistor and one capacitor.

Therefore, the SRAM devices are suitable for use in mobile stations in terms of the higher speed characteristics, the simpler controllability and the decreased power consumption, in spite of the smaller memory capacity.

However, recently, as mobile stations can communicate with E-mail and access Web sites, memories incorporated into the mobile stations have been required to have a larger memory capacity.

In order to satisfy the demand for memories incorporated into the mobile stations, pseudo SRAM devices having the above-mentioned advantages of the SEAM devices and the above-mentioned advantage of the DRAM devices have been focussed on. That is, in the pseudo SRAM devices, when an address signal without a RAS signal and a CAS signal is supplied thereto and is fetched by a chip enable (CE) signal, an access operation such as a read operation or a write operation is carried out in synchronization with an external clock signal at a higher speed than the DRAM devices.

The pseudo SRAM devices, however, still require a refresh operation for holding the memory contents in a standby mode, which is different from the conventional SRAM devices. That is, the pseudo SRAM devices have a similar cell configuration to the DRAM devices and an SRAM interface operated in synchronization with an external clock signal. A first typical pseudo SRAM device is a synchronous mobile SRAM (MSRAM) device whose cell is constructed by one MOS transistor and one capacitor (see: JP-2002-074944-A), and a second typical pseudo SRAM device is a dual port SRAM (2T-PSRAM) device whose cell is constructed by two MOS transistors and one capacitor (see: FIG. 2 of JP-2001-210074-A).

In the above-mentioned pseudo SEAM devices, an all-time refresh operation is carried out in an active mode by raising the voltages at refresh word lines triggered by an all-time refresh pulse signal in synchronization with an external clock signal, while a forced refresh operation is carried out in a special mode by raising the voltages at the refresh word lines triggered by an internally-generated forced refresh pulse signal. In this case, the all-time refresh pulse signal and the forced refresh pulse signal both have much larger periods than that of the external clock signal.

As illustrated in FIGS. 1A, 1B and 1C, in the active mode of the synchronous MSRAM devices, a read/write pulse signal RWP for normal word lines alternates with the refresh pulse signal REFP, thus avoiding the destruction of cell information. Note that, if the read/write pulse signal RWP and the refresh pulse signal REFP rise simultaneously, a multi-selection occurs to destroy cell information. Also, if a refresh pulse signal REFP rises while a restoring operation is being carried out after an all-time refresh pulse signal rises, cell information also would be destroyed.

On the other hand, as illustrated in FIGS. 2A, 2B and 2C, in the active mode of the 2T-PSRAM, since use is made of a two-port configuration, a read/write operation using a read/write pulse signal RWP for the normal word lines is carried out for one port, while a refresh operation using a refresh pulse signal REFP for the refresh word lines is carried out for the other port, thus decreasing the control time.

Note that, in the active mode of the 2T-PSRAM devices, a small difference between the voltage at a first one of one pair of bit lines and a reference voltage is sensed by the read/write pulse signal RWP to carry out a read operation, while a refresh operation is performed by the refresh pulse signal REFP upon a second one of the pair of bit lines. Therefore, if the timing of the refresh operation is shifted or advanced from its optimum timing, the rapid change of the voltage at the second bit line affects the sense operation of the first bit line due to the noise by crosstalk, thus destroying cell information.

Four special modes other than the active mode will now be explained.

(1) Sleep Mode (ZZ Mode)

A sleep mode is defined by a state where no external clock signal CLK is supplied to the device.

(2) Stop Clock Mode (Chip Selection Mode)

A stop clock mode is defined by a state where an external clock signal CLK supplied to the device is temporarily stopped. This is also called a chip selection (CCS) mode.

(3) Clock Non-selection Mode

A clock non-selection mode is defined by a state where an external clock signal CLK is supplied to the device but the external clock signal CLK is not selected by a clock enable signal CKE within the device.

(4) Long Cycle Mode

A long cycle mode is defined by a state where the frequency of an external clock signal supplied to the device is lower than a predetermined value.

In the sleep mode, the stop clock mode or the clock non-selection mode, use is never made of the external clock signal CLK. In the long cycle mode, incomplete use is made of the external clock signal CLK.

In a special mode, a forced refresh pulse signal is generated as an internal clock signal within the device to carry out a refresh operation using the refresh word lines.

When the control is transferred from one of the special modes to an active mode, an access operation such as a read operation or a write operation is restarted by using a read/write pulse signal generated in synchronization with the external clock signal CLK.

However, as illustrated in FIGS. 3A, 3B, 3C, 3D and 3E, since a forced refresh pulse signal (internal click signal) REFB is not in synchronization with an external clock signal CLK which is substantially a signal CLK' within the device, a refresh pulse signal REFP for the refresh word lines derived from the forced refresh pulse signal REFB is not in synchronization with a read/write pulse signal RWP for the normal word lines derived from the signal CLK'. As a result, in the synchronous MSRAM devices, when the read/write pulse signal RWP is superposed onto the refresh pulse signal REFP immediately after transition from a special mode to an active mode, a word line multi-selection would occur or a restore operation would be intercepted. On the other hand, in the 2T-PSRAM devices, when the read/write pulse signal RWP is shifted from the refresh pulse signal REFP immediately after transition from a special mode to an active mode, a sense operation would be incomplete.

Thus, it was difficult for the prior art pseudo SRAM device to smoothly transfer a special mode to an active mode.

SUMMARY OF THE INVENTION

It is an object of the present invention to provide a pseudo SRAM device capable of smoothly transferring a special mode to an active mode and its driving method.

According to the present invention, in a semiconductor memory device incorporating a memory core circuit requiring a refresh operation, a clock signal modifying circuit receives an external clock signal to generate a modified clock signal which is ineffective from a timing when the control is switched from an active mode to a special mode to a timing when at least one clock pulse time period of the external clock signal has passed after the control is switched from said special mode to an active mode. A forced refresh request signal generating circuit generates a forced refresh request signal at predetermined time periods and an internal clock signal having the same period as the forced refresh request signal. An all-time refresh request signal generating circuit generates an all-time refresh request signal in synchronization with the modified clock signal and the internal clock signal. A multiplexer selects the forced refresh request signal in the special mode and selects the all-time refresh request signal in the actual mode. A refresh pulse generating circuit generates a refresh pulse signal in accordance with one of the forced refresh request signal and the all-time refresh request signal selected by the multiplexer and transmits the refresh pulse signal to the memory core circuit. A read/write pulse generating circuit generates a read/write pulse signal in synchronization with the modified clock signal and transmits the read/write pulse signal to the memory core circuit.

Also, in a method for driving a semiconductor memory device incorporating a memory core circuit requiring a refresh operation, a forced refresh operation is performed upon the memory core circuit using an internally generated forced refresh request signal in a special mode. An all-time refresh operation is performed upon the memory core circuit using an external clock signal and an internal clock signal having the same period as the internally generated forced refresh request signal in an actual mode. A read/write operation is performed upon the memory core circuit using the external clock signal in the actual mode. The read/write operation performed upon the memory core circuit is prohibited for at least one clock time period of the external clock signal when the control is transferred from the special mode to the actual mode.

BRIEF DESCRIPTION OF THE DRAWINGS

The present invention will be more clearly understood from the description set forth below, as compared with the prior art, with reference to the accompanying drawings, wherein;

FIGS. 1A, 1B and 1C are timing diagrams for explaining the operation of a prior art synchronous MSRAM device;

FIGS. 3A, 3B, 3C, 3D and 3E are timing diagrams for explaining the problem in a prior art pseudo SRAM device;

DESCRIPTION OF THE PREFERRED EMBODIMENTS

Figures 2A, 2B, 2C:
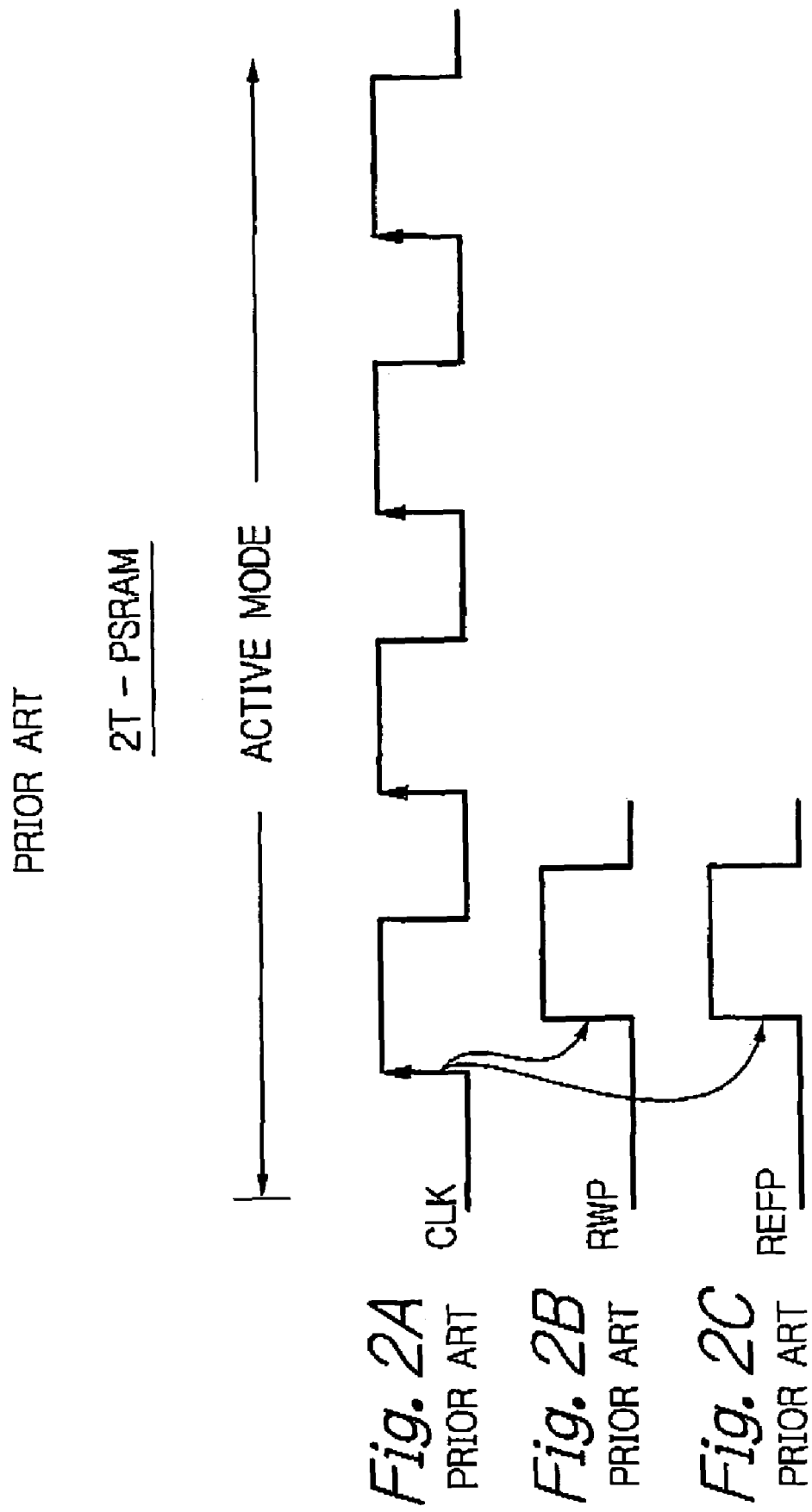
FIGS. 2A, 2B and 2C are timing diagrams for explaining the operation of a prior art 2T-PSRAM device.
Figure 4:
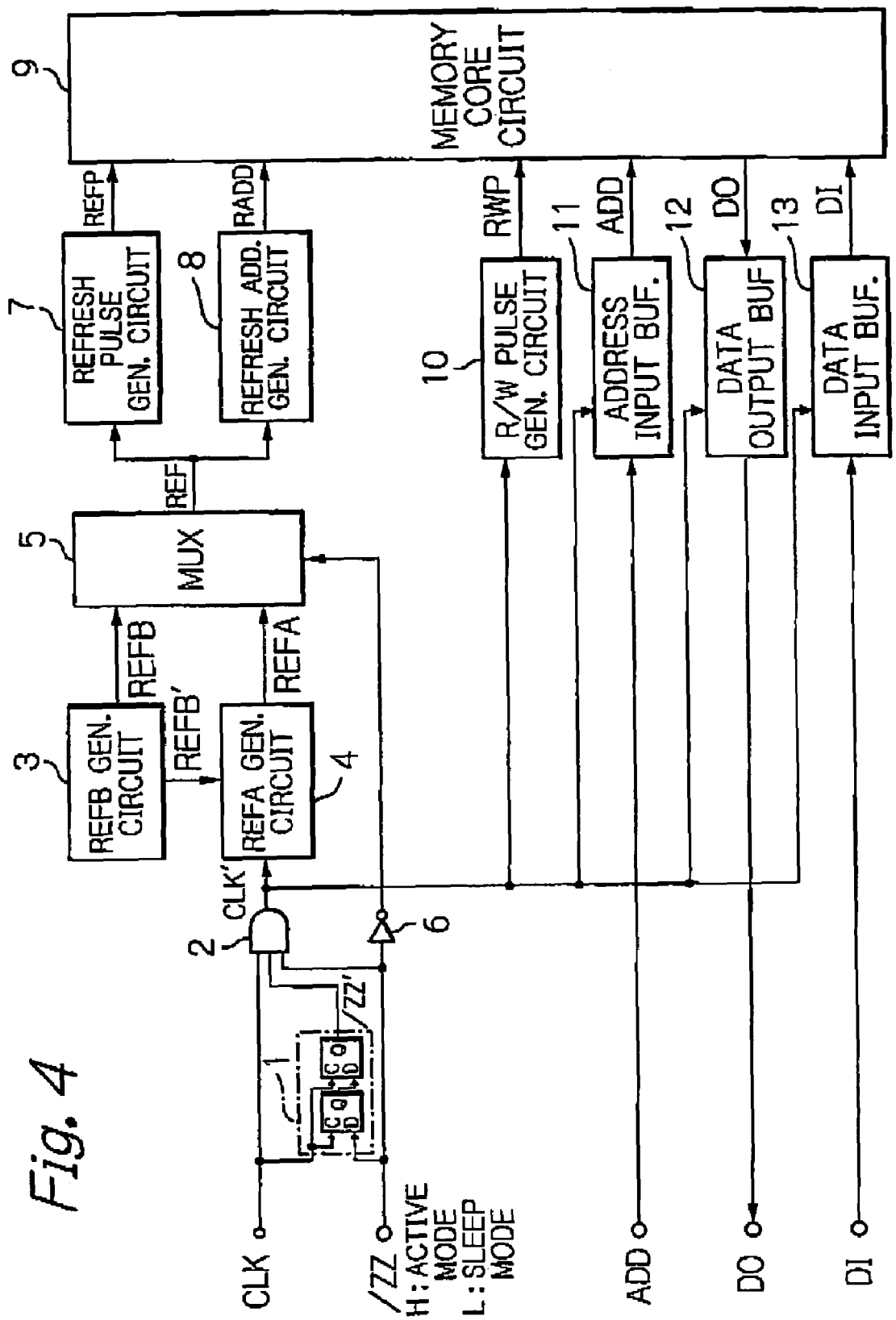
FIG. 4 is a block circuit diagram illustrating a first embodiment of the pseudo SRAM device according to the present invention.
Figure 5:
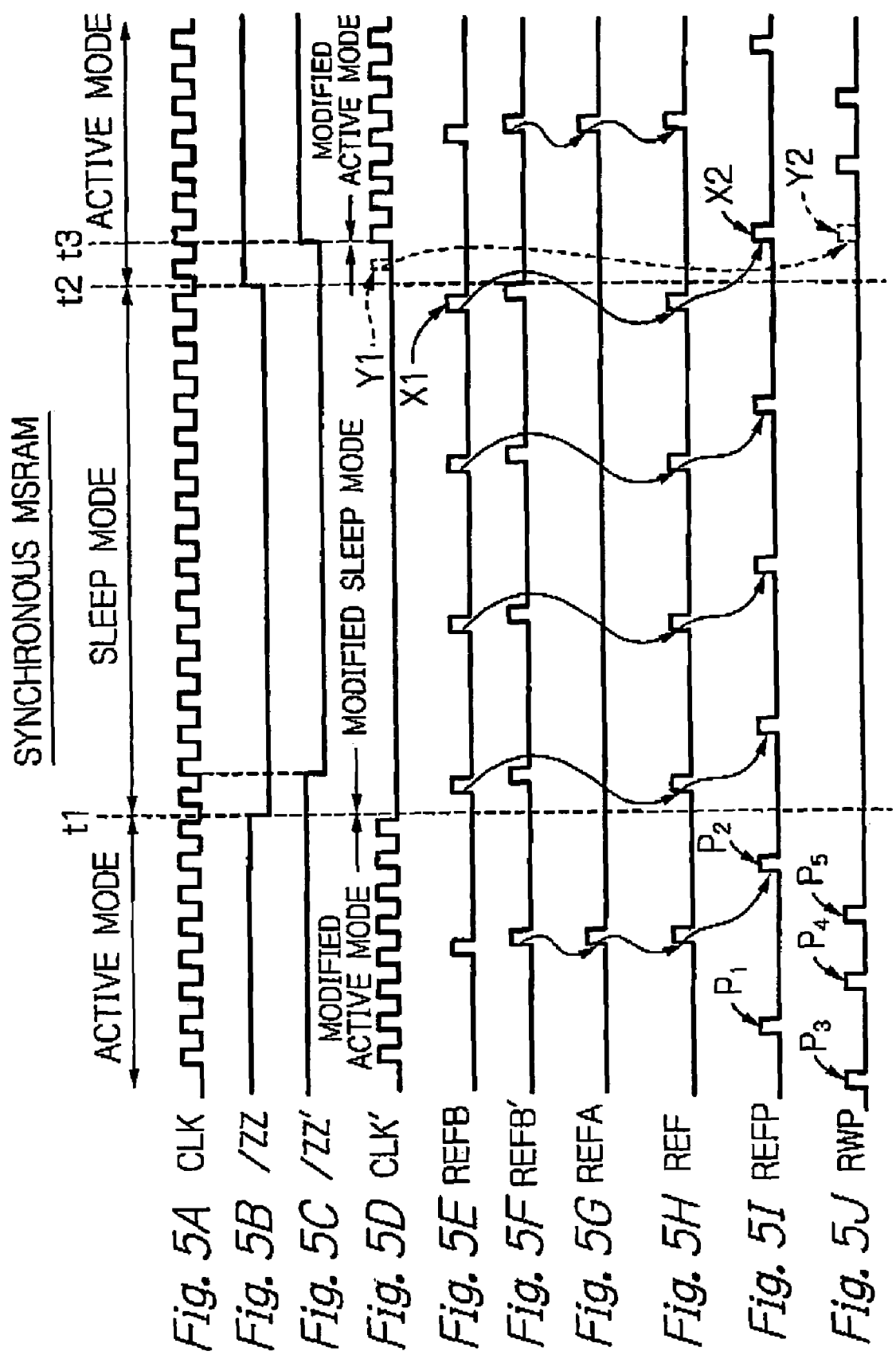
FIGS. 5A through 5J are timing diagrams for explaining the operation of the pseudo SRAM device of FIG. 4 in the case of a synchronous MSRAM type.
Figure 6:
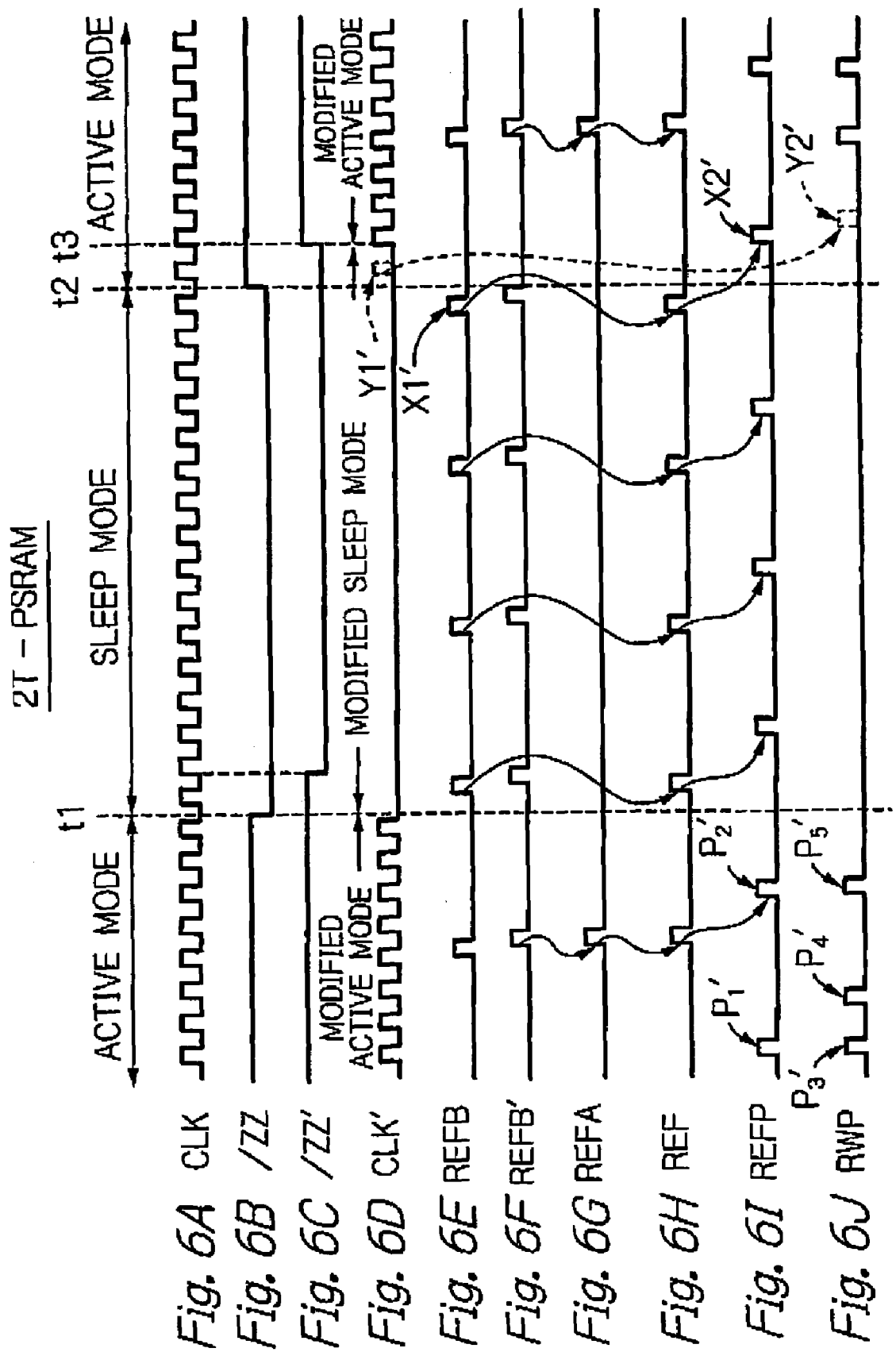
FIGS. 6A through 6J are timing diagrams for explaining the operation of the pseudo SRAM device of FIG. 4 in the case of a 2T-PSRAM type.

In FIG. 4, which illustrates a first embodiment of the pseudo SRAM device according to the present invention, an external clock signal CLK as shown in FIG. 5A or 6A is supplied thereto from the exterior. A register 1 delays a special mode signal such as a sleep signal /ZZ as shown in FIG. 5B or 6B to generate a delayed sleep signal /ZZ' a shown in FIG. 5C or 6C. The register 1 is constructed by one or more serially-connected D-type flip-flops. For example, if the register 1 is constructed by one D-type flop-flop, the sleep signal /ZZ is delayed by a time period of one pulse of an external clock signal CLK. Also, if the register 1 is constructed by two serially-connected D-type flip-flops, the sleep signal /ZZ is delayed by a time period of two pulses of the external clock signal CLK.

An AND circuit 2 receives the external clock signal CLK as well as the sleep signal /ZZ and the delayed sleep signal /ZZ' to generate a modified clock signal CLK' as shown in FIG. 5D or 6D only for the active mode.

The register 1 and the AND circuit 2 form a clock signal modifying circuit.

An REFB generating circuit (a forced refresh request signal generating circuit) 3 generates a forced refresh request signal REFB at predetermined time periods as shown in FIG. 5E or 6E. The REFB generating circuit 3 is an internal clock generating circuit called a refresh timer counter. Also, the REFB generating circuit 3 generates an internal clock signal REFB' as shown in FIG. 5F or 6F which has the same frequency as the forced refresh request signal REFB but whose phase is delayed a little as compared with that of the forced refresh request signal REFB. The period of the forced refresh request signal REFB and the internal clock signal REFB' is much larger than that of the external clock signal CLK. For example, the former period is several hundreds or several thousands of the latter.

Note that the forced refresh request signal REFB will be effective only for the sleep mode, and the internal clock signal REFB' will be effective only for the active mode.

An REFA generating circuit (an all-time refresh request signal generating circuit) 4 receives the modified clock signal CLK' and the internal clock signal REFB' to generate an all-time refresh request signal REFA for the active mode. In this case, the all-time refresh request signal REFA is obtained by an AND logic between the modified clock signal CLK' and the internal clock signal REFB'.

A multiplexer 5 selects one of the force refresh request signal REFB and the all-time refresh request signal REFA in accordance with the sleep mode signal /ZZ. That is, if /ZZ is low, i.e., if the sleep mode signal /ZZ indicates a sleep mode, the multiplexer 5 selects the forced refresh request signal REFB. On the other hand, if /ZZ is high, i.e., if the sleep mode signal /ZZ indicates an active mode, the multiplexer 5 selects the all-time refresh request signal REFA. As a result, the multiplexer 5 generates a refresh request signal REF as shown in FIG. 5H or 6H derived from a combination of the forced refresh request signal REFB and the all-time refresh request signal REFA and transmits it to a refresh pulse generating circuit 7 and a refresh address generating circuit 8.

The refresh pulse generating circuit 7 generates a refresh pulse signal REFP as shown in FIG. 5I or 6I every time the refresh pulse generating circuit 7 has received a refresh request signal REF from the multiplexer 5. Also, the refresh address generating circuit 8 increments a refresh address RADD every time the refresh address generating circuit 8 has received a refresh request signal REF from the multiplexer 5.

The refresh pulse signal REFP and the refresh address RADD are supplied to a memory core circuit 9 so that the refresh pulse signal REFP is applied to one refresh word line selected in accordance with the refresh address RADD.

A read/write pulse generating circuit 10 receives the modified clock signal CLK' to generate a read/write pulse signal RWP as shown in FIG. 5J or 6J which is then applied to one normal word line selected in accordance with an address ADD supplied from an address input buffer 11. As a result, in a read mode, data DO is read from the memory core circuit 9 to a data output buffer 12. Also, in a write mode, input data DI supplied to a data input buffer 13 is written into one cell of the memory core circuit 9.

In FIG. 4, a read/write operation is carried out in a modified active mode defined by the modified clock signal CLK', not in an active mode defined by the sleep signal /ZZ (see: FIGS. 5D (6D) and 5J (6J)). On the other hand, a refresh operation based upon the forced refresh request signal REFB asynchronous to the clock signal CLK is carried out in a sleep mode (see: FIGS. 5B (6B), 5E (6E), 5H (6H) and 5I (6I)). Therefore, since there is a gap defined by the register 1 between the end time t2 of the sleep mode and the state time t3 of the modified active mode, the read/write operation never interferes with the forced refresh operation, thus smoothly transferring the sleep mode to the active mode.

Also, a refresh operation based upon the all-time refresh request signal REFA synchronous to the clock signal CLK in an active mode is carried out so as not to interfere with the read/write operation in the modified active mode.

In the case of a synchronous MSRAM type, as shown in FIGS. 5I and 5J, refresh pulse signals $P_1$ and $P_2$ alternate with read/write pulse signals $P_3$, $P_4$ and $P_5$, i.e., the refresh pulse signals $P_1$ and $P_2$ are not superposed onto the read/write pulse signals $P_3$, $P_4$ and $P_5$, thus avoiding an erroneous operation such as a word line multi-operation or an interception of a restore operation.

In the case of a 2T-PSRAM type, as illustrated in FIGS. 6I and 6J, each refresh pulse signal $P_1'$ and $P_2'$ is superposed onto one read/write pulse signal $P_3'$, $P_4'$ or $P_5'$, thus avoiding an improper sense operation.

The operation of the synchronous MSRAM type of FIG. 4 as shown in FIGS. 5A through 5J will be explained next in detail.

In an active mode before time t1, the sleep mode signal /ZZ and the modified sleep mode signal /ZZ' are both high as shown in FIGS. 5B and 5C, so that the clock signal CLK passes through the AND circuit 2. Therefore, the modified clock signal CLK' is the same as the clock signal CLK as shown in FIGS. 5A and 5D.

On the other hand, the modified clock signal CLK' with the internal clock signal REFB' as shown in FIG. 5F is supplied to the REFA generating circuit 4, the REFA generating circuit 4 generates the all-time refresh request signal REFA as shown in FIG. 5G which is selected by the multiplexer 5 as the refresh request signal REF as shown in FIG. 5H and is then transmitted to the refresh pulse generating circuit 7 and the refresh address generating circuit 8. Thus, the refresh pulse signal REFP is generated by the refresh pulse generating circuit 7 in accordance with the all-time refresh signal REFA as shown in FIG. 5I. Also, the read/write pulse signal RWP is generated by the read/write pulse generating circuit 10, so that the read/write pulse signal RWP is not superposed onto the refresh pulse signal REFP as shown in FIG. 5J.

In a sleep mode between time t1 and time t2, the sleep mode signal /ZZ is low as shown in FIG. 5B, so that the clock signal CLK cannot pass through the AND circuit 2. Therefore, the modified clock signal CLK' is low as shown in FIG. 5D. As a result, since the modified clock signal CLK' with the internal clock signal REFB' as shown in FIG. 5F is not supplied to the REFA generating circuit 4, the REFA generating circuit 4 does not generate the all-time refresh request signal REFA as shown in FIG. 5G. In this case, the forced fresh request signal REFB as shown in FIG. 5F is selected by the multiplexer 5 as the refresh request signal REF as shown in FIG. 5H and is then transmitted to the refresh pulse generating circuit 7 and the refresh address generating circuit 8. Thus, the refresh pulse signal REFP is generated by the refresh pulse generating circuit 7 in accordance with the forced refresh signal REFB as shown in FIG. 5I. Also, the read/write pulse signal RWP is not generated by the read/write pulse generating circuit 10, so that no read/write operation is carried out.

Note that if a forced refresh request signal REFB is generated at the end of the sleep mode as indicated by X1 in FIG. 5E, its corresponding refresh pulse signal REFP as indicated by X2 in FIG. 5I would be generated after the sleep mode.

However, in a transition state between time t2 and time t3 from the sleep mode to the active mode, since no modified clock signal CLK' is still generated as indicated by Y1 in FIG. 5D, no read/write pulse signal RWP is generated as indicated by Y2 in FIG. 5J. Therefore, the read/write pulse signal RWP is not superposed onto the refresh pulse signal REFP as shown in FIGS. 5I and 5J.

The operation of the 2T-PSRAM type of FIG. 4 as shown in FIGS. 6A through 6J will be explained in detail. Even in this case, a forced refresh request signal REFB is generated at the end of the sleep mode as indicated by X1' in FIG. 6E, its corresponding refresh pulse signal REFP as indicated by X2' in FIG. 6I would be generated after the sleep mode.

However, in a transition state between time t2 and time t3 from the sleep mode to the active mode, since no modified clock signal CLK' is still generated as indicated by Y1' in FIG. 6D, no read/write pulse signal RWP is generated as indicated by Y2' in FIG. 6J. Therefore, the read/write pulse signal RWP is not superposed onto the refresh pulse signal REFP as shown in FIGS. 6I and 6J.

Figure 7:
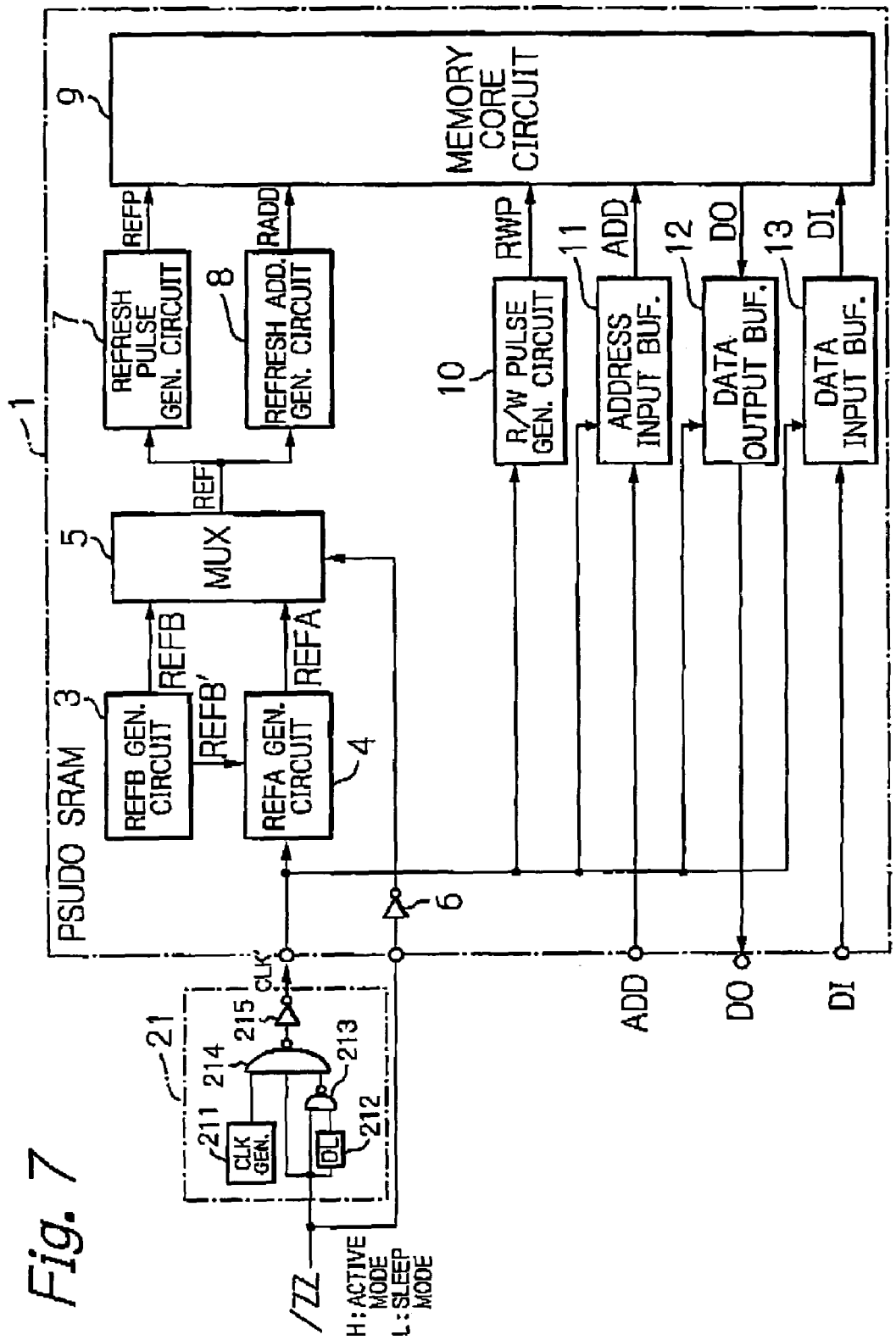
FIG. 7 is a block circuit diagram illustrating a second embodiment of the pseudo SRAM device according to the present invention.
Figure 8:
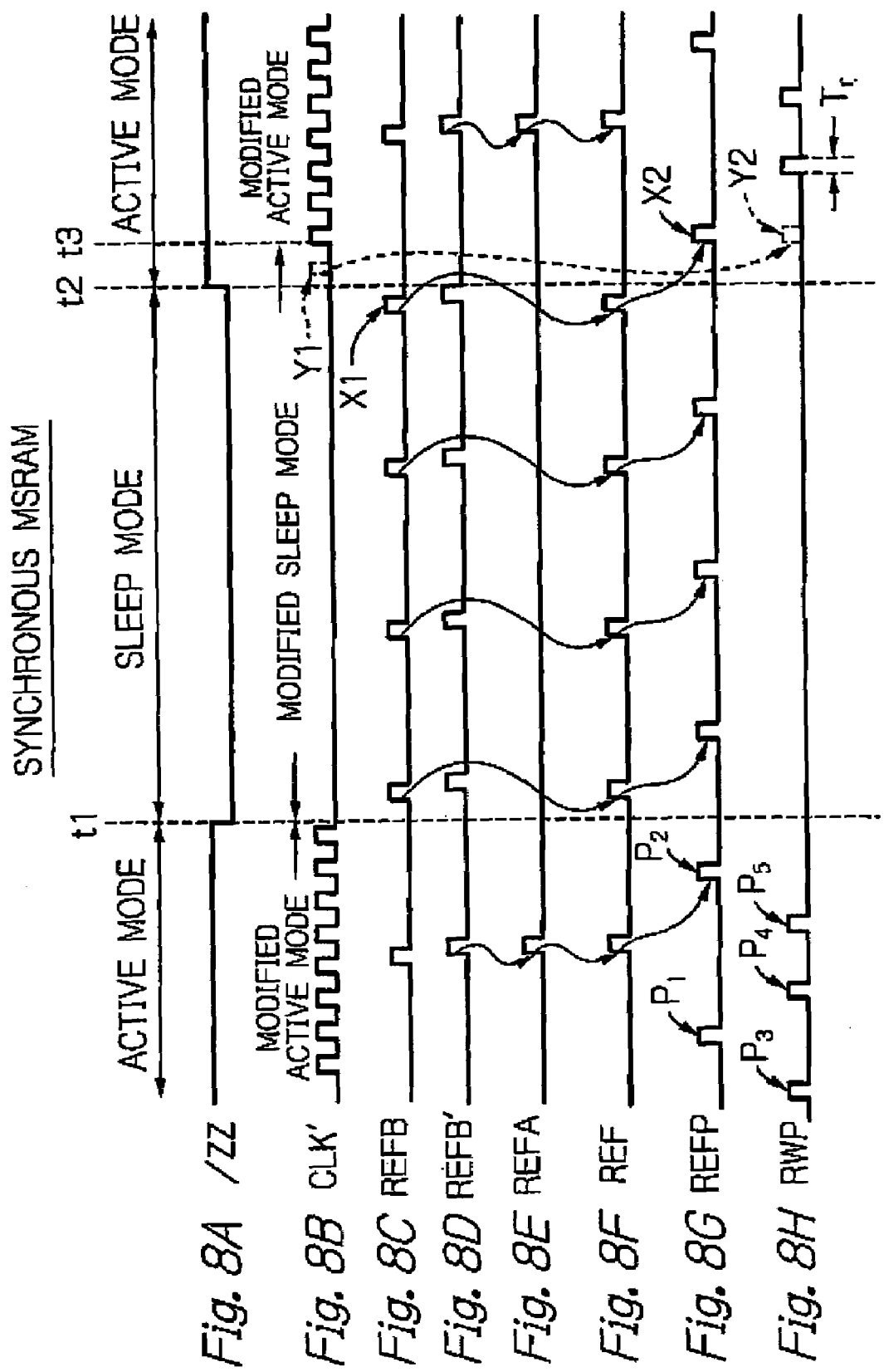
FIGS. 8A through 8H are timing diagrams for explaining the operation of the pseudo SRAM device of FIG. 7 in the case of a synchronous MSRAM type.
Figure 9:
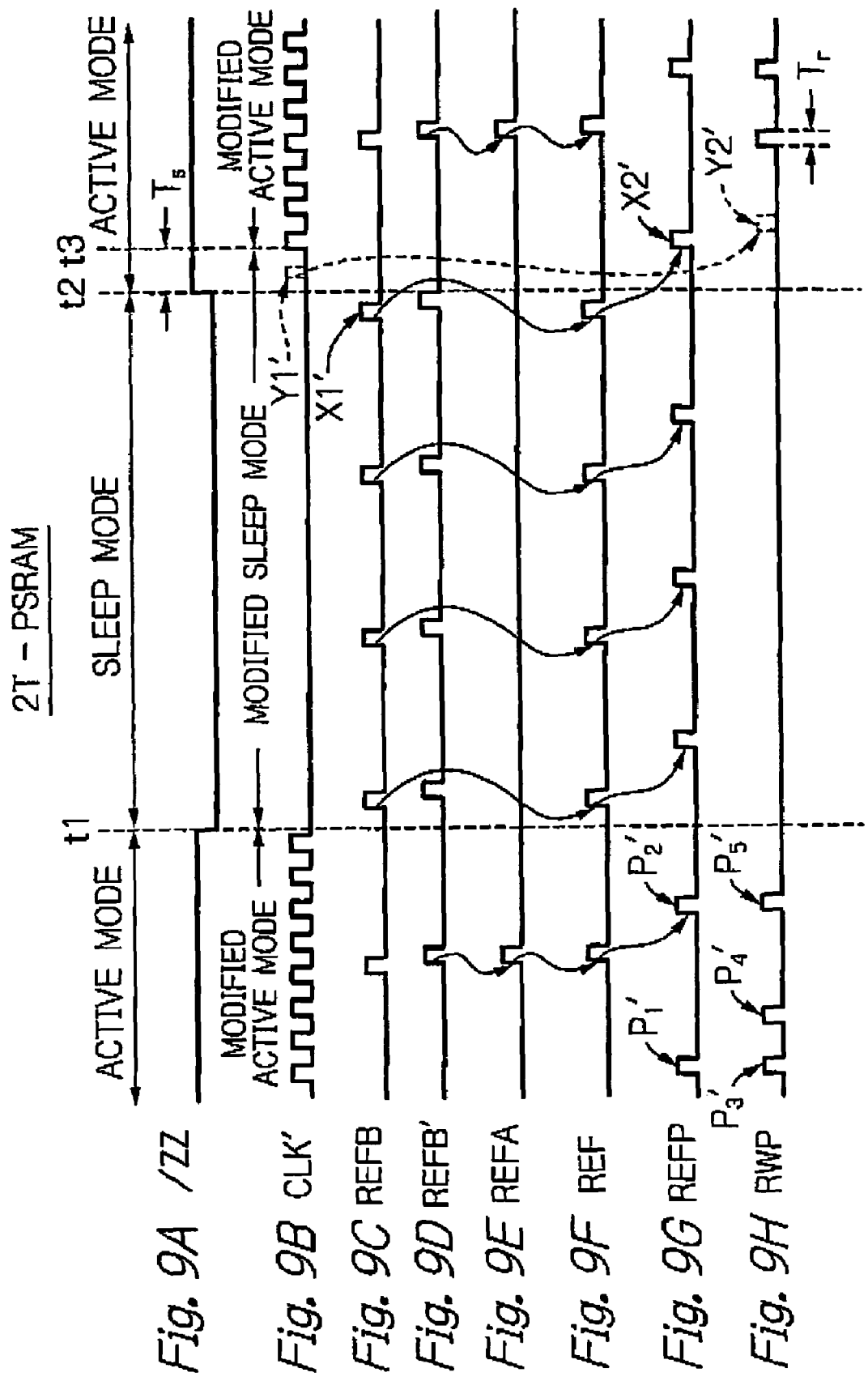
FIGS. 9A through 9H are timing diagrams for explaining the operation of the pseudo SRAM device of FIG. 7 in the case of a 2T-PSRAM type.

In FIG. 7, which illustrates a second embodiment of the pseudo SRAM device according to the present invention, a clock generating circuit 21 is externally provided instead of the register 1 and the AND circuit 2 of FIG. 4. The clock generating circuit 21 receives a special mode signal such as a sleep signal /ZZ as shown in FIG. 8A or 9A to generate an external clock signal CLK' as shown in FIG. 8B or 9B. That is, the clock signal generating circuit 21 stops the generation of the clock signal CLK' immediately after the sleep signal /ZZ is switched from low to high, and restarts the generation of the clock signal CLK' after a set-up time $T_s$ has passed when the sleep signal /ZZ is switched from low to high. The set-up time $T_s$ can be adjusted by a delay time due to the connections within the clock generating circuit 21 or by introducing a logic circuit similar to the register 1 of FIG. 4 thereinto. For example, the clock generating circuit 21 is constructed by a clock generating circuit 211, a rising edge detecting circuit formed by a delay circuit 212 having a delay time (set-up) time $T_s$ and a NAND circuit 213, a NAND circuit 214 and an inverter 215. In this case, the set-up time $T_s$ is adjusted to be sufficiently longer than a refresh pulse time $T_r$, as shown in FIG. 8J or 9J.

The operation of the synchronous MSRAM type of FIG. 7 as shown in FIGS. 8A through 8H will be explained next in detail.

In an active mode before time t1, the sleep mode signal /ZZ is high as shown in FIG. 8A and the clock signal CLK' is shown in FIG. 8B.

On the other hand, the clock signal CLK' with the internal clock signal REFB' as shown in FIG. 8D is supplied to the REFA generating circuit 4, the REFA generating circuit 4 generates the all-time refresh request signal REFA as shown in FIG. 8E which is selected by the multiplexer 5 as the refresh request signal REF as shown in FIG. 8F and is then transmitted to the refresh pulse generating circuit 7 and the refresh address generating circuit 8. Thus, the refresh pulse signal REFP is generated by the refresh pulse generating circuit 7 in accordance with the all-time refresh signal REFA as shown in FIG. 8G. Also, the read/write pulse signal RWP is generated by the read/write pulse generating circuit 10, so that the read/write pulse signal RWP is not superposed onto the refresh pulse signal REFP as shown in FIG. 8H.

In a sleep mode between time t1 and time t2, the sleep mode signal /ZZ is low as shown in FIG. 8A, and the clock signal CLK' is low as shown in FIG. 8B. Therefore, the clock signal CLK' with the internal clock signal REFB' as shown in FIG. 8D is not supplied to the REFA generating circuit 4, the REFA generating circuit 4 does not generate the all-time refresh request signal REFA as shown in FIG. 8E. In this case, the forced fresh request signal REFB as shown in FIG. 8D is selected by the multiplexer 5 as the refresh request signal REF as shown in FIG. 8F and is then transmitted to the refresh pulse generating circuit 7 and the refresh address generating circuit 8. Thus, the refresh pulse signal REFP is generated by the refresh pulse generating circuit 7 in accordance with the forced refresh signal REFB as shown in FIG. 8G. Also, the read/write pulse signal RWP is not generated by the read/write pulse generating circuit 10, so that no read/write operation is carried out.

Note that if a forced refresh request signal REFB is generated at the end of the sleep mode as indicated by X1 in FIG. 8C, its corresponding refresh pulse signal REFP as indicated by X2 in FIG. 8G would be generated after the sleep mode.

However, in a transition state between time t2 and time t3 from the sleep mode to the active mode, since no clock signal CLK' is still generated as indicated by Y1 in FIG. 8B, no read/write pulse signal RWP is generated as indicated by Y2 in FIG. 8H. Therefore, the read/write pulse signal RWP is not superposed onto the refresh pulse signal REFP as shown in FIGS. 8G and 8H.

The operation of the 2T-PSRAM type of FIG. 7 as shown in FIGS. 9A through 9H will be explained next in detail. Even in this case, a forced refresh request signal REFB is generated at the end of the sleep node as indicated by X1' in FIG. 9C, its corresponding refresh pulse signal REFP as indicated by X2' in FIG. 9G would be generated after the sleep mode.

However, in a transition state between time t2 and time t3 from the sleep mode to the active mode, since no clock signal CLK' is still generated as indicated by Y1' in FIG. 9B, no read/write pulse signal RWP is generated as indicated by Y2' in FIG. 9H. Therefore, the read/write pulse signal RWP is not superposed onto the refresh pulse signal REFP as shown in FIGS. 9G and 9H.

Figure 10:
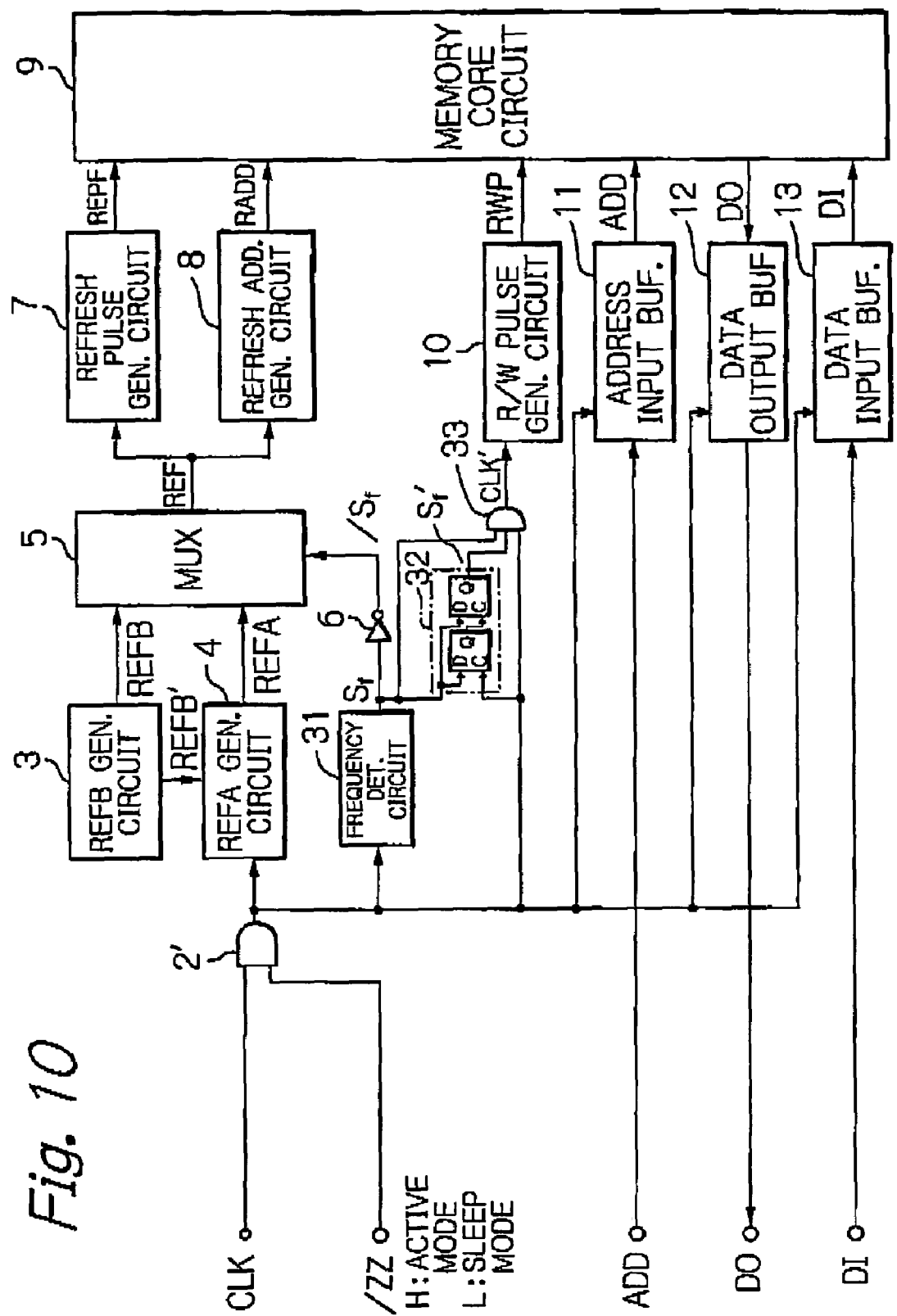
FIG. 10 is a block circuit diagram illustrating a third embodiment of the pseudo SRAM device according to the present invention.
Figure 11:
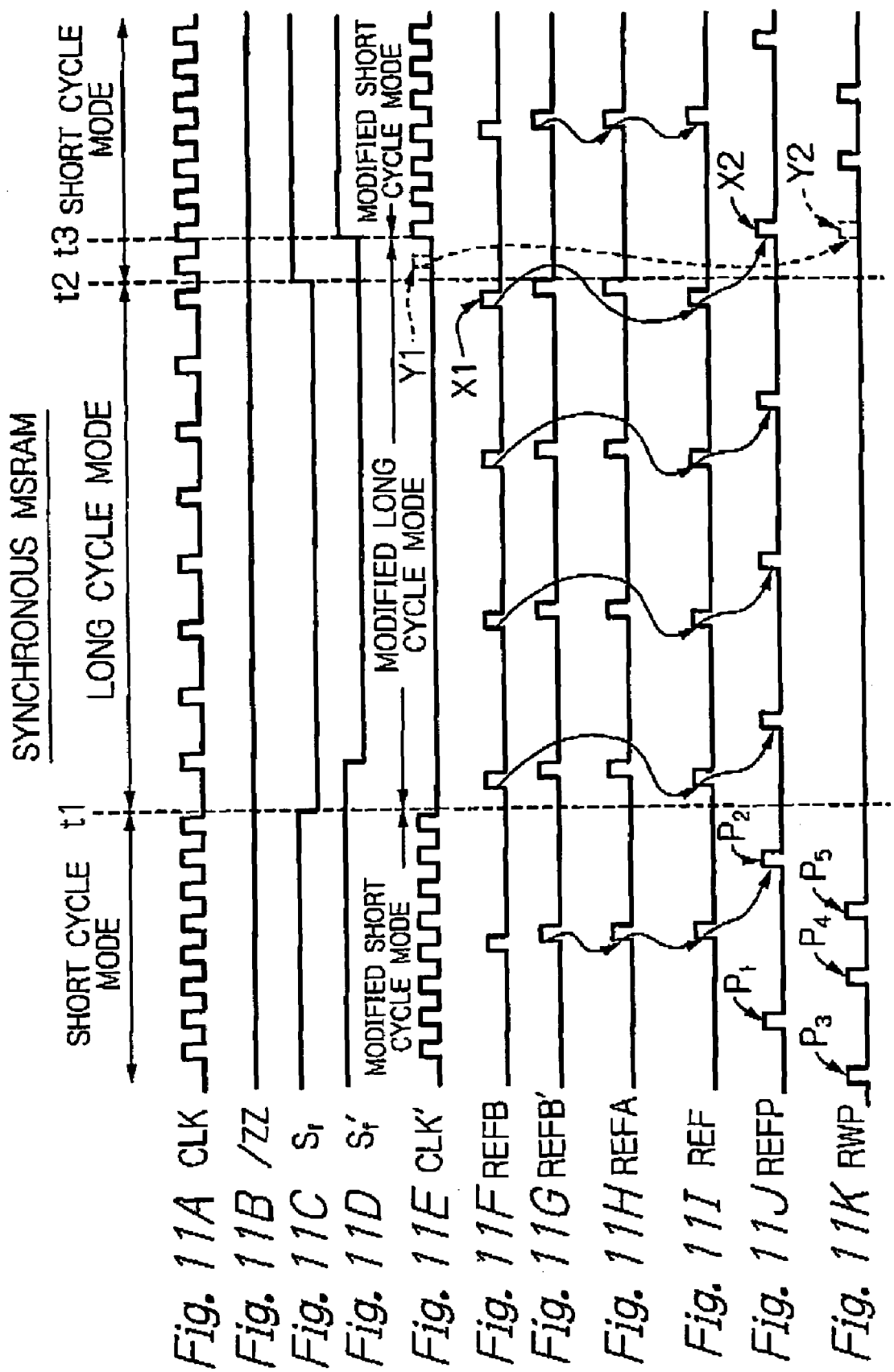
FIGS. 11A through 11K are timing diagrams for explaining the operation of the pseudo SRAM device of FIG. 10.

In FIG. 10, which illustrates a third embodiment of the pseudo SRAM device according to the present invention, an external clock signal CLK supplied from the exterior is assumed to have a short cycle mode and a long cycle mode as shown in FIG. 11A.

Also, the register 1 of FIG. 4 is deleted, and the AND circuit 2 of FIG. 4 is replaced by an AND circuit 2' which receives the external clock signal CLK and the sleep mode signal /ZZ.

Further, a frequency determining circuit 31 is connected to the output of the AND circuit 2', to thereby determine whether the frequency of the clock signal CLK is higher than a predetermined value. Only when the frequency of the clock signal CLK is higher than the predetermined value, is the output signal $S_f$ of the frequency determining circuit 31 high. Otherwise, the output signal $S_f$ of the frequency determining circuit 31 is low.

The output signal $S_f$ of the frequency determining circuit 31 is used for controlling the multiplexer 5 via the inverter 6. That is, when $S_f$ is high, i.e., when the frequency of the clock signal CLK is higher than the predetermined value, the multiplexer 5 selects the all-time refresh request signal REFA. Otherwise, the multiplexer 5 selects the forced refresh request signal REFB.

A register 32 delays the output signal $S_f$ of the frequency determining circuit 32 to generate a delayed signal $S_f'$. The register 32 is constructed by one or more serially-connected D-type flip-flops. For example, if the register 32 is constructed by one D-type flip-flop, the output signal $S_f$ is delayed by a time period of one pulse of the clock signal CLK. Also, if the register 32 is constructed by two serially-connected D-type flip-flops, the output signal $S_f$ is delayed by a time period of two pulses of the clock signal CLK.

An AND circuit 33 receives the clock signal CLK, where the sleep mode signal /ZZ is high, as well as the output signal $S_f$ and the delayed signal $S_f'$, to generate a modified clock signal CLK' as shown in FIG. 11E only for the short cycle mode.

The register 32 and the AND circuit 33 form a clock signal modifying circuit.

In FIG. 10, a read/write operation is carried out in a modified short cycle mode defined by the modified clock signal CLK', not in a short cycle mode defined by the output signal $S_f$ (see: FIG. 11E). On the other hand, a refresh operation based upon the forced refresh request signal REFB asynchronous to the clock signal CLK is carried out in a long cycle mode (see: FIGS. 11C, 11J, 11I and 11J). Therefore, since there is a gap defined by the register 32 between the end time t2 of the long cycle mode and the start time t3 of the modified short cycle mode, the read/write operation never interferes with the forced refresh operation, thus enabling a smooth transfer of the long cycle mode to the short cycle mode.

Also, a refresh operation based upon the all-time refresh request signal REFA synchronous to the clock signal CLK in a short cycle mode is carried out so as not to interfere with the read/write operation in the modified short cycle mode.

In the case of a synchronous MSRAM type, as shown in FIGS. 11J and 11K, refresh pulse signals $P_1$ and $P_2$ alternate with read/write pulse signals $P_3$, $P_4$1, and $P_5$, i.e., the refresh pulse signals $P_1$ and $P_2$ are not superposed onto the read/write pulse signals $P_3$, $P_4$ and $P_5$, thus avoiding an erroneous operation such as a word line multi-operation or an interception of a restore operation.

The operation of the synchronous MSRAM type of FIG. 10 as shown in FIGS. 11A thorough 11K will be explained next in detail.

In a short cycle mode before time t1, assume that the sleep node signal /ZZ is high as shown in FIG. 11B, so that the clock signal CLK passes through the AND circuit 2'. Therefore, the output signal $S_f$ of the frequency determining circuit 31 is high as shown in FIG. 11C, and its delay output signal $S_f'$ is also high as shown in FIG. 11D. Therefore, the AND circuit 33 generates the modified clock signal CLK' which is the same as the clock signal CLK, as shown in FIGS. 11A and 11E.

On the other hand, the clock signal CLK with the internal clock signal REFB' as shown in FIG. 11G is supplied to the REFA generating circuit 4, the REFA generating circuit 4 generates the all-time refresh request signal REFA as shown in FIG. 11H which is selected by the multiplexer 5 as the refresh request signal REF as shown in FIG. 11I and is then transmitted to the refresh pulse generating circuit 7 and the refresh address generating circuit 8. Thus, the refresh pulse signal REFP is generated by the refresh pulse generating circuit 7 in accordance with the all-time refresh signal REFA as shown in FIG. 11H. Also, the read/write pulse signal RWP is generated by the read/write pulse generating circuit 10, so that the read/write pulse signal RWP is not superposed onto the refresh pulse signal REFP, as shown in FIG. 11K.

In a long cycle mode between time t1 and time t2 also assume that the sleep mode signal /ZZ is high as shown in FIG. 11B. In this case, the output signal $S_f$ of the frequency determining circuit 31 is switched from high to low as shown in FIG. 11C, and its delayed signal $S_f'$ is then switched from high to low as shown in FIG. 11D. Therefore, the modified clock signal CLK' is made low by the AND circuit 33 as shown in FIG. 11E.

On the other hand, the forced refresh request signal REFB as shown in FIG. 11F, and the all-time refresh request signal REFA as shown in FIG. 11H are supplied to the multiplexer 5. In this case, the forced fresh request signal REFB as shown in FIG. 11F is selected by the multiplexer 5 as the refresh request signal REF as shown in FIG. 11I and is then transmitted to the refresh pulse generating circuit 7 and the refresh address generating circuit 8. Thus, the refresh pulse signal REFP is generated by the refresh pulse generating circuit 7 in accordance with the forced refresh signal REFB as shown in FIG. 11F. Also, the read/write pulse signal RWP is not generated by the read/write pulse generating circuit 10, so that no read/write operation is carried out.

Note that if a forced refresh request signal REFB is generated at the end of the sleep mode as indicated by X1 in FIG. 11F, its corresponding refresh pulse signal REFP as indicated by X2 in FIG. 11J would be generated after the long cycle mode.

However, in a transition state between time t2 and time t3 from the long cycle mode to the short cycle mode, since no modified clock signal CLK' is still generated as indicated by Y1 in FIG. 11E, no read/write pulse signal RWP is generated as indicated by Y2 in FIG. 11K. Therefore, the read/write pulse signal RWP is not superposed onto the refresh pulse signal REFP as shown in FIGS. 11J and 11K.

Even in the 2T-PSRAM type pseudo SRAM device, in the same way as in the synchronous MSRAM device, the read/write pulse signal RWP is not superposed onto the refresh pulse signal REFP, thus avoiding an improper sense operation.

Figure 12:
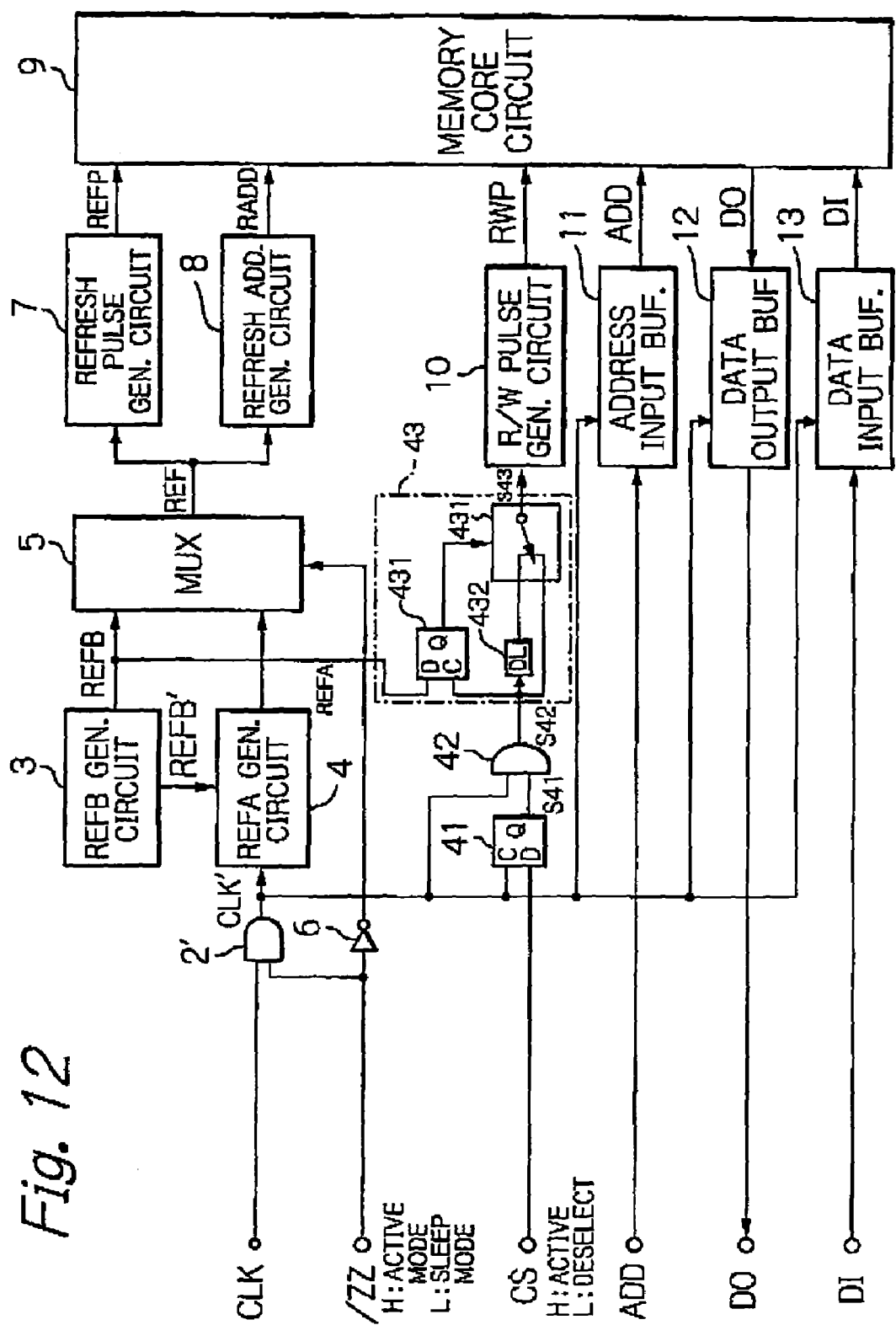
FIG. 12 is a block circuit diagram illustrating a fourth embodiment of the pseudo SRAM device according to the present invention.

In FIG. 12, which illustrates a fourth embodiment of the pseudo SRAM device according to the present invention, assume that the control is switched from a chip non-selection state to a chip selection state, i.e., an active state.

Also, the register 1 of FIG. 4 is deleted, and the AND circuit 2 of FIG. 4 is replaced by an AND circuit 2' which receives the external clock signal CLK and the sleep mode signal /ZZ.

Further, a chip selection signal CS is supplied to the device of FIG. 12. That is, a register 41 formed by a D-type flip-flop fetches the chip selection signal CS in synchronization with the clock signal CLK and transmits it to one input of an AND circuit 42 whose other input receives the clock signal CLK.

Only when the output signal S41 of the register 41 is high, is the output signal S42 of the AND circuit 42 the same as the clock signal CLK. Otherwise, the output signal S42 of the AND circuit 42 is low. In other words, when the chip selection signal CS is high, the AND circuit 42 passes the clock signal CLK therethrough.

A determination circuit 43 receives the output signal S2 of the AND circuit 42 and the forced refresh request signal REFB from the REFB generating circuit 3 to generate an output signal S43.

The register 41, the AND circuit 42 and the determination circuit 43 form a clock signal modifying circuit.

The determination circuit 43 determines whether or not there is a forced refresh request signal REFB when the clock signal CLK rises. Note that, if there is such a forced refresh request signal REFB, a read/write pulse signal RWP would be superposed onto a refresh pulse signal REFP. Therefore, when there is no forced refresh request signal REFB, the determination circuit 43 passes the clock signal CLK without delay, while, when there is such a forced refresh request signal REFB, the determination circuit 43 passes the clock signal CLK with delay which is about several ns to 50 ns.

The determination circuit 43 constructed by a D-type flip-flop 431 for fetching the forced refresh request signal REFB in synchronization with the output signal S42 of the AND circuit 42, a delay circuit 432 having a delay time DL and a switch 433 for passing the output signal of the delay circuit 432 in accordance with the output signal of the D-type flip-flop 431.

The operation of the pseudo SRAM device of FIG. 12 will be explained next in detail with reference to FIGS. 13A through 13H.

Figure 13:
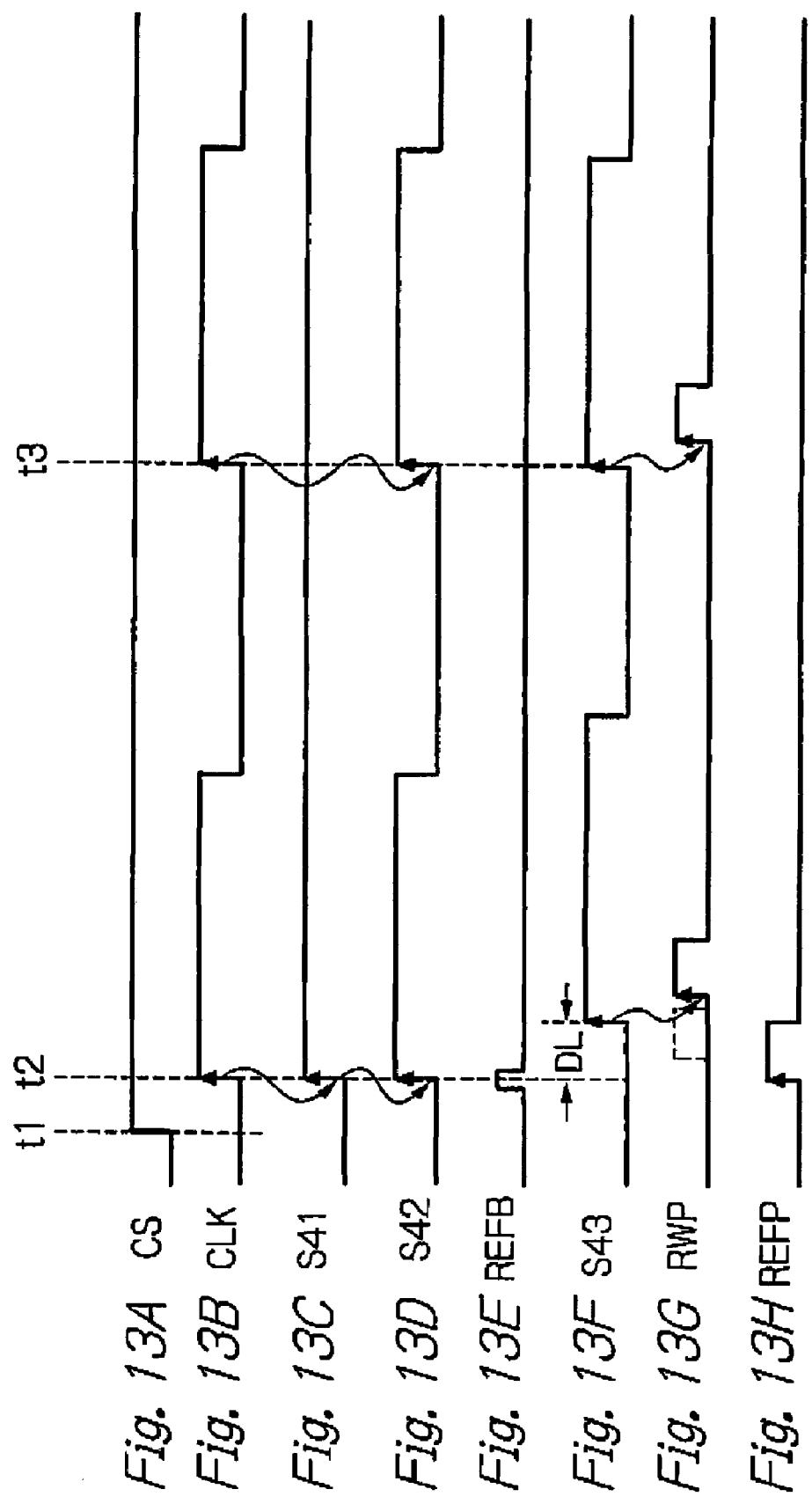
FIGS. 13A through 13H are timing diagrams for explaining the operation of the pseudo SRAM device of FIG. 12.

First, at time t1, the chip selection signal CS rises as shown in FIG. 13A.

Next, at time t2, the clock signal CLK rises as shown in FIG. 13B, so that the output signal S41 of the register 41 is switched from low to high. As a result, the AND circuit 42 passes the clock signal CLK therethrough so that the output signal S42 of the AND circuit 42 is equal to the clock signal CLK as shown in FIG. 13D.

At time t2, since there is a forced refresh request signal REFB as shown in FIG. 13E, the determination circuit 43 passes the clock signal CLK therethrough with a delay time DL, so that the output signal S43 of the determination circuit 43 is delayed for the delay time DL as compared with the clock signal CLK, as shown in FIG. 13F. As a result, the read/write pulse signal RWP as shown in FIG. 13G is shifted from the expected refresh pulse signal REFP as shown in FIG. 13H.

Next, at time t3, the clock signal CLK again rises as shown in FIG. 13B, so that the output signal S41 of the register 41 is still high. As a result, the AND circuit 42 passes the clock signal CLK therethrough so that the output signal S42 of the AND circuit 42 is equal to the clock signal CLK as shown in FIG. 13D.

At time t3, since there is no forced refresh request signal REFB as shown in FIG. 13E, the determination circuit 43 passes the block signal CLK therethrough without a delay time DL, so that the output signal S43 of the determination circuit 43 is approximately the same as the clock signal CLK, as shown in FIG. 13F. As a result, the read/write pulse signal RWP is not shifted as shown in FIG. 13G while there is no expected refresh pulse signal REFP as shown in FIG. 13H.

Figure 14:
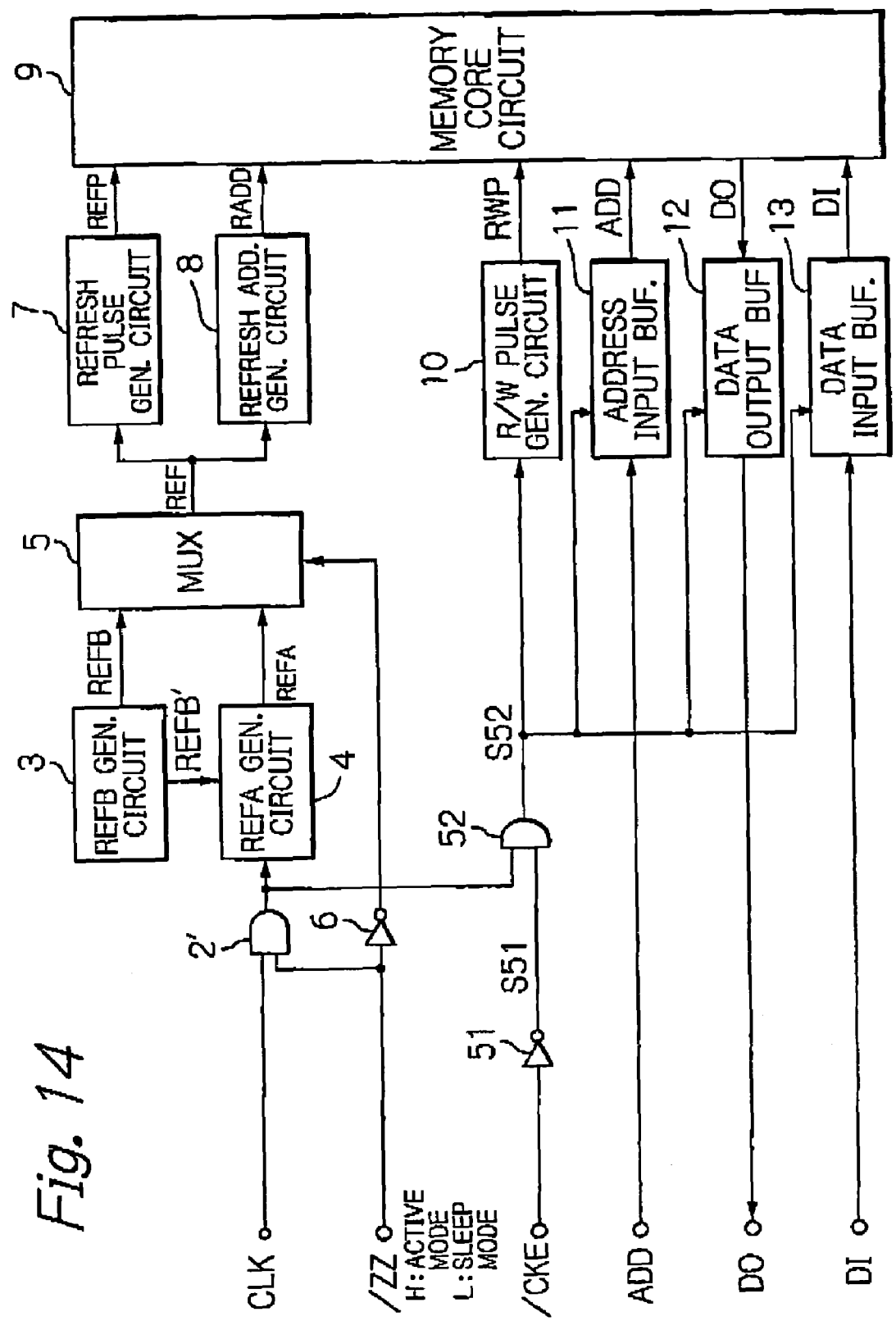
FIG. 14 is a block circuit diagram illustrating a fifth embodiment of the pseudo SRAM device according to the present invention.

In FIG. 14, which illustrates a fifth embodiment of the pseudo SRAM device according to the present invention, assume that control is switched from a clock non-selection state to a clock selection state, i.e., an active state.

Also, the register 1 of FIG. 4 is deleted, and the AND circuit 2 of FIG. 4 is replaced by an AND circuit 2' which receives the external clock signal CLK and the sleep mode signal /ZZ.

Further, a clock enable signal /CKE is supplied to the device of FIG. 14. That is, an inverter 51 fetches the clock enable signal /CKE and transmits it to one input of an AND circuit 52 whose other input receives the clock signal CLK.

Only when the output signal S51 of the inverter 51 is high, is the output signal S52 of the AND circuit 52 the same as the clock signal CLK. Otherwise, the output signal S52 of the AND circuit 52 is low. In other words, when the clock enable signal /CKE is low, the AND circuit 52 passes the clock signal CLK therethrough.

The operation of the pseudo SRAM device of FIG. 14 will be explained next in detail with reference to FIGS. 15A through 15D.

Figure 15:
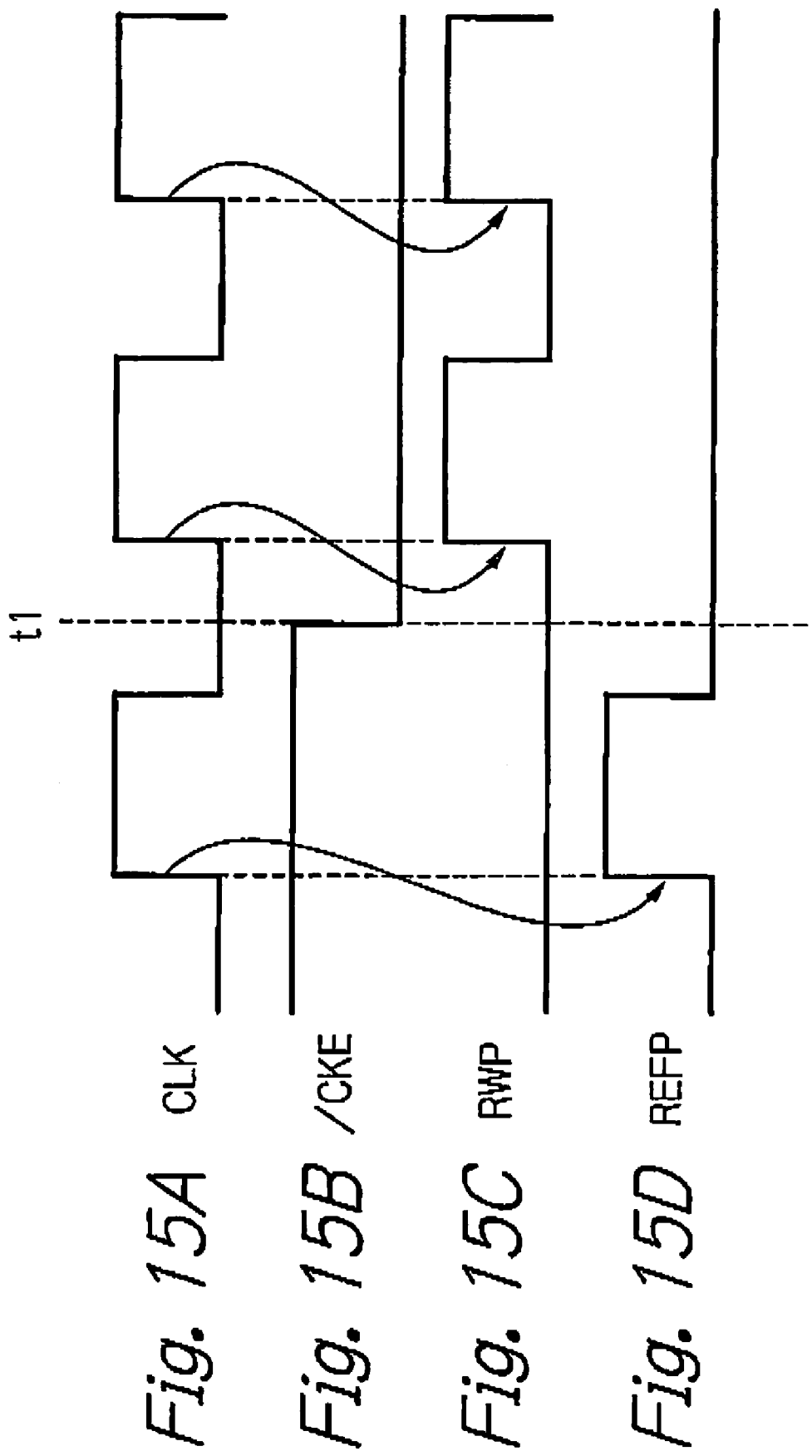
FIGS. 15A through 15D are timing diagrams for explaining the operation of the pseudo SRAM device of FIG. 14.

At time t1, the clock enable signal /CKE falls as shown in FIG. 15A.

Therefore, a read/write pulse signal RWP is generated only after time t1 as shown in FIG. 15C. On the other hand, a refresh pulse request signal REFP is generated in accordance with a forced refresh request signal REFB only before time t1 is shown in FIG. 15D. Therefore, the read/write pulse signal RWP is not superposed onto the refresh pulse signal. Thus, an erroneous operation such as a word line multi-operation or an interception of a restore operation and an improper sense operation can be avoided.

Note that two or more of the above-described embodiments can be combined into one pseudo SRAM device. For example, in FIG. 16, the first embodiment of FIG. 4, the third embodiment of FIG. 10 and the fifth embodiment of FIG. 14 are combined into one pseudo SRAM device.

Figure 16:
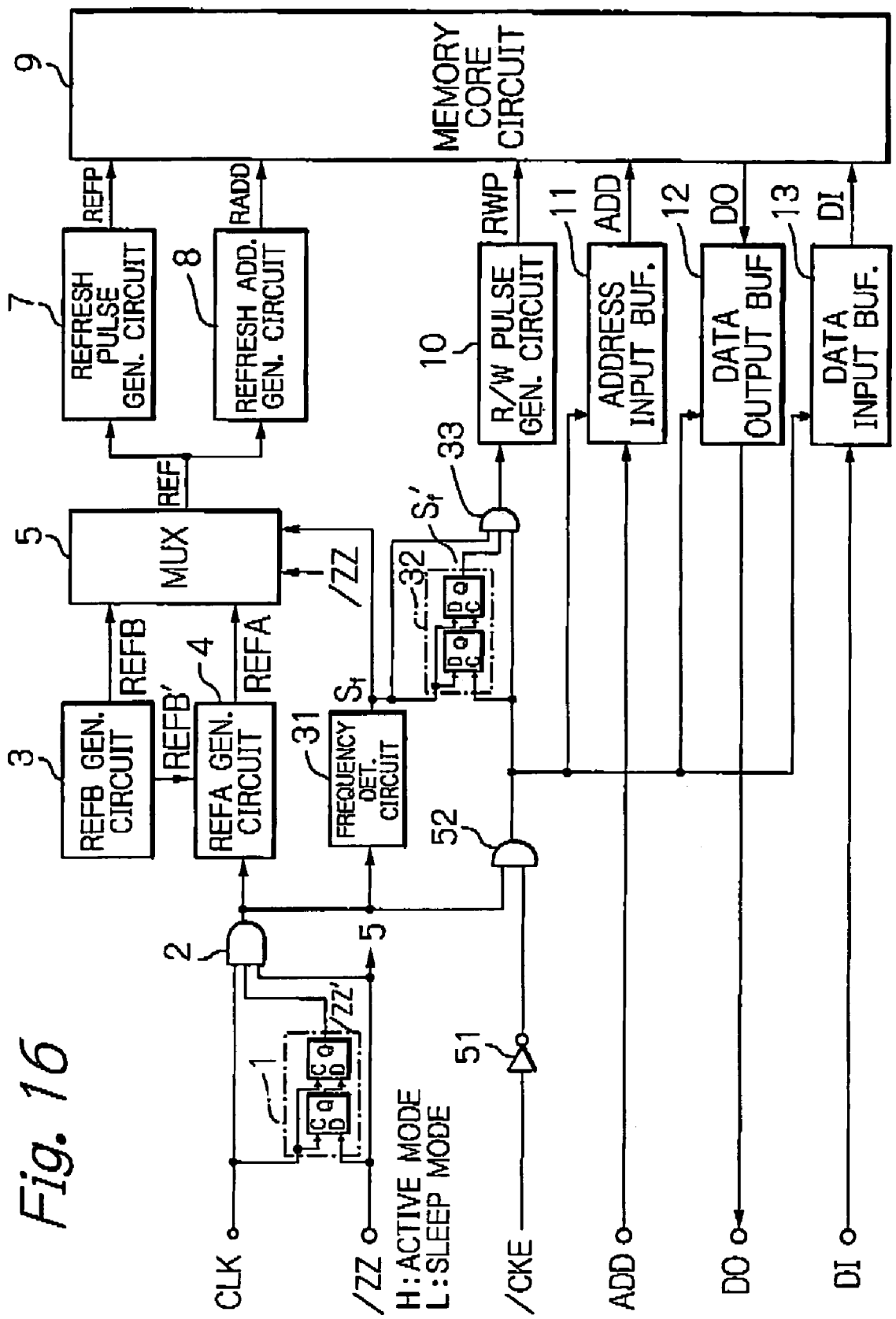
FIG. 16 is a block circuit diagram illustrating a sixth embodiment of the pseudo SRAM device according to the present invention.
Figure 17:
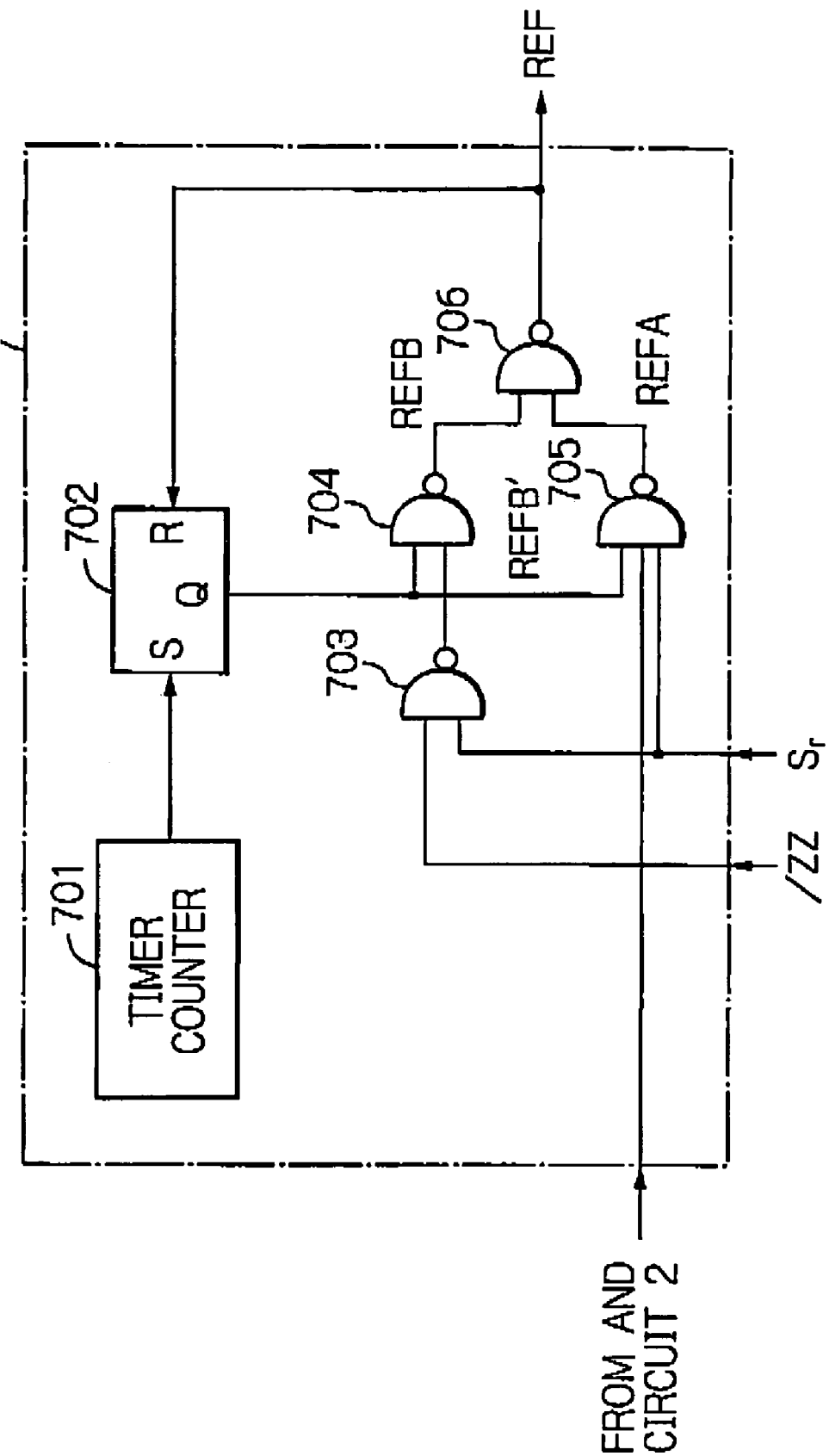
FIG. 17 is a detailed circuit diagram of the REFB generating circuit, the REFA generating circuit and the multipler of FIG. 16.

The REFB generating circuit 3, the REFA generating circuit 4 and the multiplexer 5 of FIG. 16 are illustrated in FIG. 17. In FIG. 17, a timer counter 701 generates a periodic signal for setting an RS-flip-flop 702 which is reset by the refresh request signal REF. A NAND circuit 703 receives the sleep signal /ZZ and the output signal Sr of the frequency determining circuit 31. A NAND circuit 704 receives the output signals of the flip-flop 702 and the NAND circuit 703 to generate the forced refresh request signal REFB, and a NAND circuit 705 receives the output signals of the flip-flop 702, the AND circuit 2 (FIG. 16) and the frequency determining circuit 31 to generate the all-time refresh request signal REFA. A NAND circuit 705 receives the output signals REFB and REFA of the NAND circuit 704 and 705 to generate the refresh request signal REF (=REFB or REFA).

As explained hereinabove, according to the present invention, since refresh pulse signals are not superposed onto read/write pulse signals, the transfer of a special mode to an active mode can be smoothly carried out.

The invention claimed is:

1. A semiconductor memory device incorporating a memory core circuit requiring a refresh operation, comprising:
a clock signal modifying circuit adapted to receive an external clock signal to generate a modified clock signal which is ineffective from a timing when the control is switched from an active mode to a special mode to a timing when at least one clock pulse time period of said external clock signal has passed after the control is switched from said special mode to an active mode;

a forced refresh request signal generating circuit adapted to generate a forced refresh request signal at predetermined time periods and an internal clock signal having the same period as said forced refresh request signal;

an all-time refresh request signal generating circuit connected to said clock modifying circuit and adapted to generate an all-time refresh request signal in synchronization with said modified clock signal and said internal clock signal;

a multiplexer connected to said forced refresh request signal generating circuit and said all-time refresh request signal generating circuit and adapted to select said forced refresh request signal in said special mode and select said all-time refresh request signal in said actual mode;

a refresh pulse generating circuit connected to said multiplexer and adapted to generate a refresh pulse signal in accordance with one of said forced refresh request signal and said all-time refresh request signal selected by said multiplexer and transmit said refresh pulse signal to said memory core circuit; and a read/write pulse generating circuit connected to said modified clock signal generating circuit and adapted to generate a read/write pulse signal in synchronization with said modified clock signal and transmit said read/write pulse signal to said memory core circuit.

2. The semiconductor memory device as set forth in claim 1, wherein said clock signal modifying circuit comprises:

a register adapted to receive said external clock signal and a special mode signal to delay said special mode signal by a time period of at least one clock pulse of said external clock signal; and an AND circuit connected to said register and adapted to receive said external clock signal, said special mode signal and an output signal of said register to generate said modified clock signal.

3. The semiconductor memory device as set forth in claim 1, wherein said special mode is a sleep mode.

4. A semiconductor memory device incorporating a memory core circuit requiring a refresh operation, comprising:

a forced refresh request signal generating circuit adapted to generate a forced refresh request signal at predetermined time periods and an internal clock signal having the same period as said forced refresh request signal;

an all-time refresh request signal generating circuit connected to said clock modifying circuit and adapted to receive said modified clock signal and generate an all-time refresh request signal in synchronization with a modified clock signal and said internal clock signal, said modified clock signal being ineffective from a timing when the control is switched from an active mode to a special mode to a timing when at least one clock pulse time periods of said modified clock signal has passed after the control is switched from said special mode to an active mode;

a multiplexer connected to said forced refresh request signal generating circuit and said all-time refresh request signal generating circuit and adapted to select said forced refresh request signal in said special mode and select said all-time refresh request signal in said actual mode in accordance with said special mode and said active mode;

a refresh pulse generating circuit connected to said multiplexer and adapted to generate a refresh pulse signal in accordance with one of said forced refresh request signal and said all-time refresh request signal selected by said multiplexer and transmit said refresh pulse signal to said memory core circuit; and a read/write pulse generating circuit adapted to receive said modified clock signal and generate a read/write pulse signal in synchronization with said modified clock signal and transmit said read/write pulse signal to said memory core circuit.

5. The semiconductor memory device as set forth in claim 4, wherein said special mode is a sleep mode.

6. A semiconductor memory device incorporating a memory core circuit requiring a refresh operation, comprising:

a forced refresh request signal generating circuit adapted to generate a forced refresh request signal at predetermined time periods and an internal clock signal having the same period as said forced refresh request signal;

an all-time refresh request signal generating circuit adapted to receive an external clock signal to generate an all-time refresh request signal in synchronization with said clock signal and said internal clock signal;

a frequency determining circuit adapted to receive said external clock signal to determine whether or not the frequency of said external clock signal is larger than a predetermined value;

a multiplexer connected to said forced refresh request signal generating circuit, said all-time refresh request signal generating circuit and said frequency determining circuit and adapted to select said forced refresh request signal in said special mode and select said all-time refresh request signal in said actual mode;

a refresh pulse generating circuit connected to said multiplexer and adapted to generate a refresh pulse signal in accordance with one of said forced refresh request signal and said all-time refresh request signal selected by said multiplexer and transmit said refresh pulse signal to said memory core circuit;

a clock signal modifying circuit connected to said frequency determining circuit and adapted to generate a modified clock signal which is ineffective from a timing when the frequency of said external clock signal becomes smaller than said predetermined value to a timing when at least one clock pulse time period of said external clock signal has passed after the frequency of said external clock signal becomes larger than said predetermined value; and a read/write pulse generating circuit connected to said modified clock signal generating circuit and adapted to generate a read/write pulse signal in synchronization with said modified clock signal and transmit said read/write pulse signal to said memory core circuit.

7. The semiconductor memory device as set forth in claim 6, wherein said clock signal modifying circuit comprises:

a register adapted to receive said external clock signal and the output signal of said frequency determining circuit to delay the output signal of said frequency determining circuit by a time period of at least one clock pulse of said external clock signal; and an AND circuit connected to said frequency determining circuit and said register and adapted to receive said external clock signal, the output signal of said frequency determining circuit and the output signal of said register to generate said modified clock signal.

8. A semiconductor memory device incorporating a memory core circuit requiring a refresh operation, comprising:
a forced refresh request signal generating circuit adapted to generate a forced refresh request signal at predetermined time periods and an internal clock signal having the same period as said forced refresh request signal;
an all-time refresh request signal generating circuit adapted to receive an external clock signal to generate an all-time refresh request signal in synchronization with said clock signal and said internal clock signal;
a multiplexer connected to said forced refresh request signal generating circuit and said all-time refresh request signal generating circuit and adapted to select said forced refresh request signal in a special mode and select said all-time refresh request signal in an actual mode;
a refresh pulse generating circuit connected to said multiplexer and adapted to generate a refresh pulse signal in accordance with one of said forced refresh request signal and said all-time refresh request signal selected by said multiplexer and transmit said refresh pulse signal to said memory core circuit;
a clock signal modifying circuit connected to said forced refresh request signal generating circuit and adapted to receive said external clock signal and a chip selection signal to generate a modified clock signal which is obtained by delaying said external clock signal in accordance with a relationship between said forced refresh request signal and said external clock signal when said chip selection signal is being enabled; and
a read/write pulse generating circuit connected to said-modified clock signal generating circuit and adapted to generate a read/write pulse signal in synchronization with said modified clock signal and transmit said read/write pulse signal to said memory core circuit.

9. The semiconductor memory device as set forth in claim 8, wherein said clock signal modifying circuit comprises:
a register adapted to receive said external clock signal and said chip selection signal to fetch said chip selection signal in accordance with said external clock signal;
an AND circuit connected to the output of said register and adapted to pass said external clock signal in accordance with the output signal of said register; and
a determination circuit connected to said AND circuit and said forced refresh request signal generating circuit and adapted to delay the output signal in accordance with said forced refresh request signal.

10. The semiconductor memory device as set forth in claim 8, wherein said special mode is a sleep mode.

11. A semiconductor memory device incorporating a memory core circuit requiring a refresh operation, comprising:
a forced refresh request signal generating circuit adapted to generate a forced refresh request signal at predetermined time periods and an internal clock signal having the same period as said forced refresh request signal;
an all-time refresh request signal generating circuit adapted to receive an external clock signal to generate an all-time refresh request signal in synchronization with said clock signal and said internal clock signal;
a multiplexer connected to said forced refresh request signal generating circuit and said all-time refresh request signal generating circuit and adapted to select said forced refresh request signal in a special mode and select said all-time refresh request signal in an actual mode;
a refresh pulse generating circuit connected to said multiplexer and adapted to generate a refresh pulse signal in accordance with one of said forced refresh request signal and said all-time refresh request signal selected by said multiplexer and transmit said refresh pulse signal to said memory core circuit;
an AND circuit adapted to receive an external clock signal and a clock enable signal to pass said external clock signal therethrough in accordance with said clock enable signal; and
a read/write pulse generating circuit connected to said modified clock signal generating circuit and adapted to generate a read/write pulse signal in synchronization with said modified clock signal and transmit said read/write pulse signal to said memory core circuit.

12. The semiconductor memory device as set forth in claim 11, wherein said special mode is a sleep mode.

13. A method for driving a semiconductor memory device incorporating a memory core circuit requiring a refresh operation, comprising:
performing a forced refresh operation upon said memory core circuit using an internally generated forced refresh request signal in a special mode;
performing an all-time refresh operation upon said memory core circuit using an external clock signal and an internal clock signal having the same period as said internally generated forced refresh request signal in an actual mode;
performing a read/write operation upon said memory core circuit using said external clock signal in said actual mode; and
prohibiting said read/write operation upon said memory core circuit for at least one clock time period of said external clock signal when the control is transferred from said special mode to said actual mode.

14. The method as set forth in claim 13, wherein said special mode is a sleep mode.

15. The method as set forth in claim 13, wherein said special mode is a long cycle mode where the frequency of said external clock signal is smaller than a predetermined value.

16. A method for driving a semiconductor memory device incorporating a memory core circuit requiring a refresh operation, comprising:
performing a forced refresh operation upon said memory core circuit using an internally generated forced refresh request signal in a special mode;
performing an all-time refresh operation upon said memory core circuit using an external clock signal and an internal clock signal having the same period as said internally generated forced refresh request signal in an actual mode;
performing a read/write operation upon said memory core circuit using said external clock signal in said actual mode; and
delaying said external clock signal in accordance with said forced refresh request signal and said external clock signal when a chip selection signal is being enabled.

17. A method for driving a semiconductor memory device incorporating a memory core circuit requiring a refresh operation, comprising:

performing a forced refresh operation upon said memory core circuit using an internally generated forced refresh request signal in a special mode;

performing an all-time refresh operation upon said memory core circuit using an external clock signal and an internal clock signal having the same period as said internally generated forced refresh request signal in an actual mode;

performing a read/write operation upon said memory core circuit using said external clock signal in said actual mode; and prohibiting said read/write operation upon said memory core circuit when a clock enable signal is not being enabled.

* * * * *